United States Patent [19]
Himeno et al.

[11] Patent Number: 5,808,575
[45] Date of Patent: Sep. 15, 1998

[54] GAIN VARYING DEVICE CAPABLE OF VARYING EACH GAIN OF ANALOG AND DIGITAL SIGNALS

[75] Inventors: Takuji Himeno, Chiba; Hiroshi Takahata, Tokyo, both of Japan

[73] Assignee: Sony Corporation, Tokyo, Japan

[21] Appl. No.: 741,808

[22] Filed: Oct. 31, 1996

[30] Foreign Application Priority Data

Nov. 6, 1995 [JP] Japan .................................. 7-309703

[51] Int. Cl.⁶ .................................................. H03M 1/18
[52] U.S. Cl. .................................................. 341/139
[58] Field of Search .................................. 341/139, 140, 341/144, 155; 324/115

[56] References Cited

U.S. PATENT DOCUMENTS 4,091,380  5/1978  Yu ............................................. 341/139
4,584,558  4/1986  Maschek .................................. 341/139

FOREIGN PATENT DOCUMENTS 2210741  6/1989  United Kingdom ............ H03M 1/06
2229333  9/1990  United Kingdom ............. H03G 3/20

*Primary Examiner*—Brian K. Young
*Attorney, Agent, or Firm*—Jay H. Maioli

[57] ABSTRACT

A gain varying device includes a zero-cross detector for detecting a zero cross or a vicinity thereof in an input analog or digital signal, an analog gain varier for varying the gain of the input analog signal, and a digital gain varier for varying the gain of the input digital signal. In this device, the timing to vary the gain of the analog or digital signal in the individual gain varier is determined in accordance with the zero-cross detection timing, so that smooth switching can be realized in the gain varying operation without generation of any audible noise.

11 Claims, 17 Drawing Sheets

FIG. 5

| STEP | dB | COEFFICIENT |
|---|---|---|
| 0 | 0 | 400h |
| 1 | -0.25 | 3E4h |
| 2 | -0.5 | 3C8h |
| 3 | -0.75 | 3ACh |
| 4 | -1 | 390h |
| 5 | -1.25 | 378h |
| 6 | -1.5 | 35Ch |
| 7 | -1.75 | 344h |

F I G. 6A
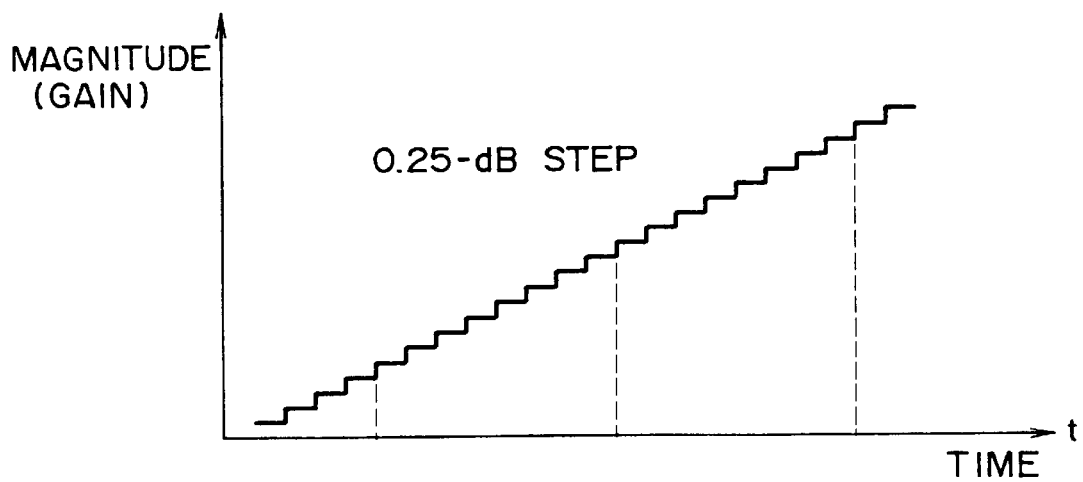
F I G. 6B
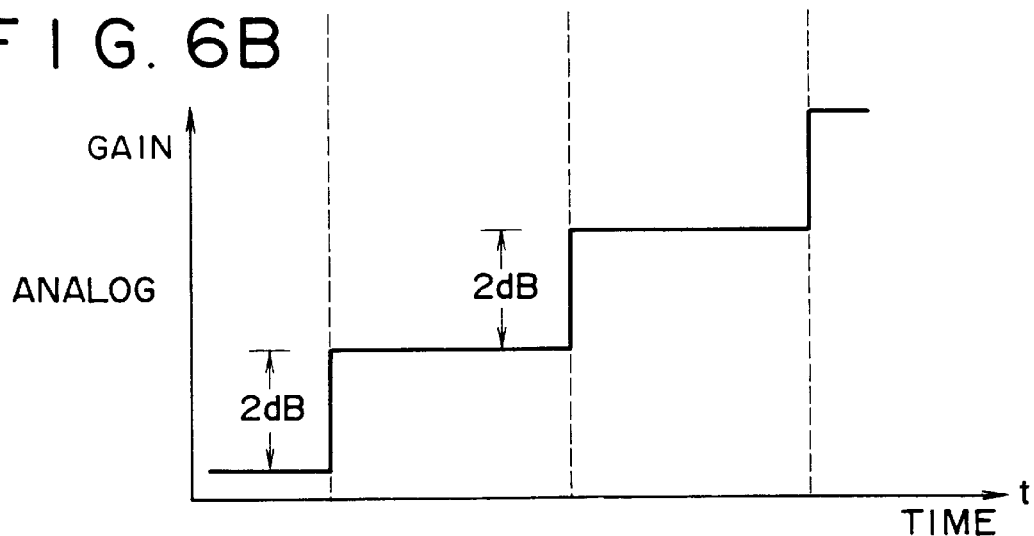
F I G. 6C
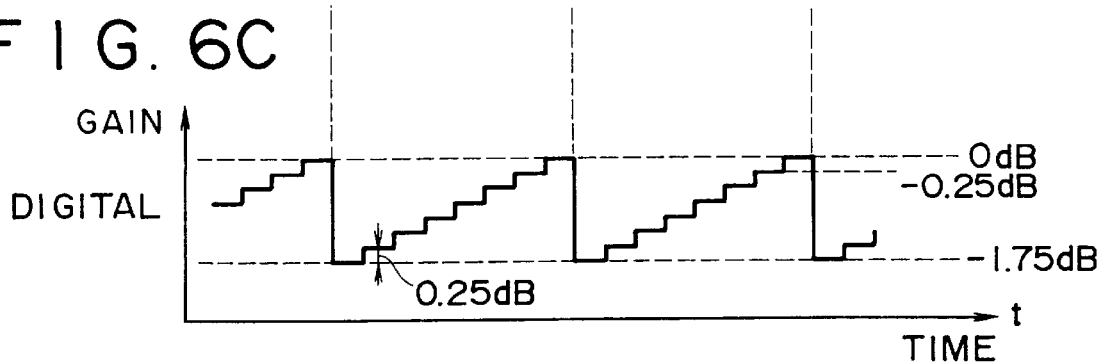

ANALOG WAVEFORM

ZERO-CROSS COMPARATOR OUTPUT

EDGE DETECTION (ANALOG GAIN LOAD)

ANALOG GAIN

DELAY OUTPUT (DIGITAL GAIN LOAD)

DIGITAL GAIN

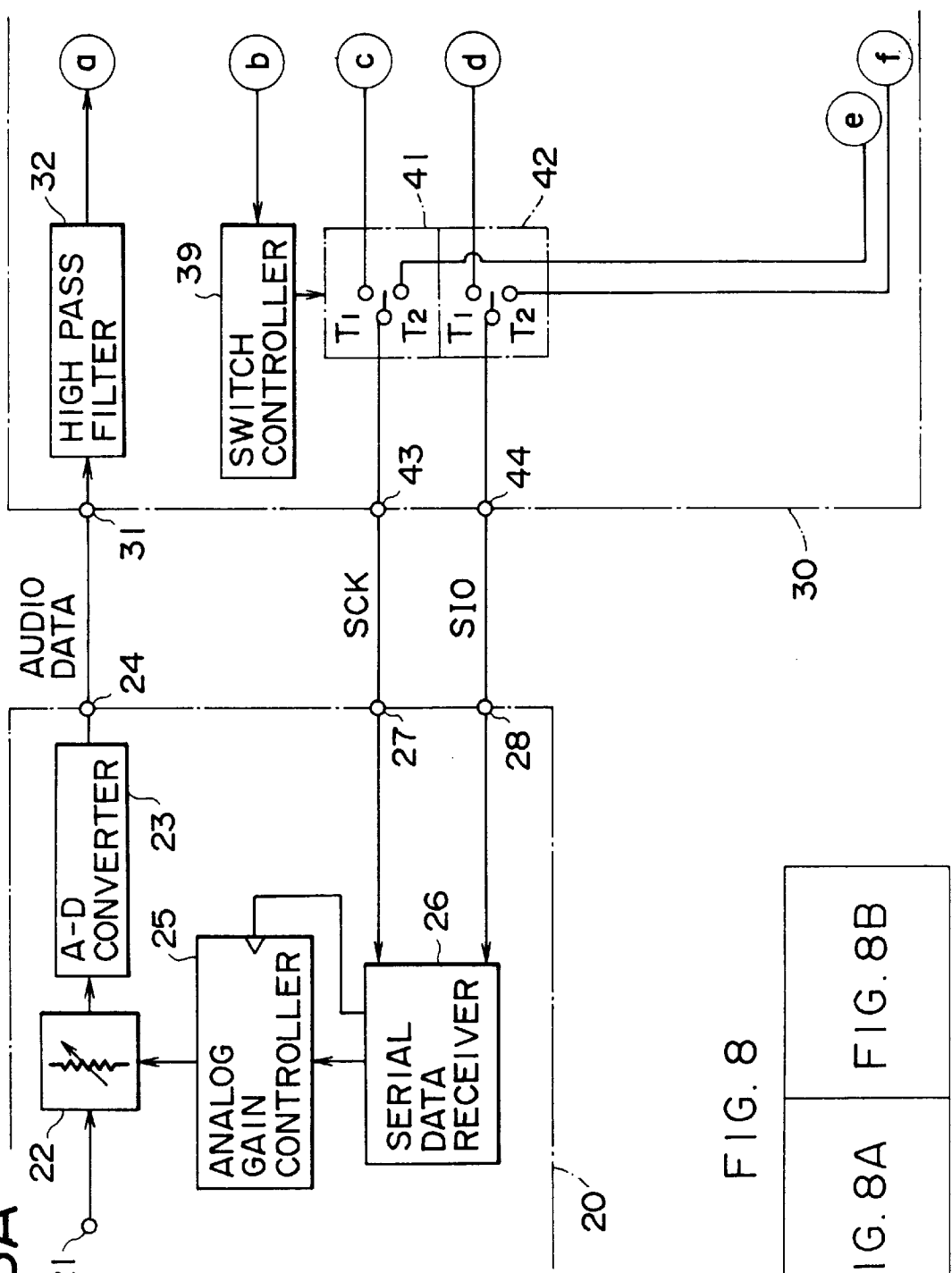

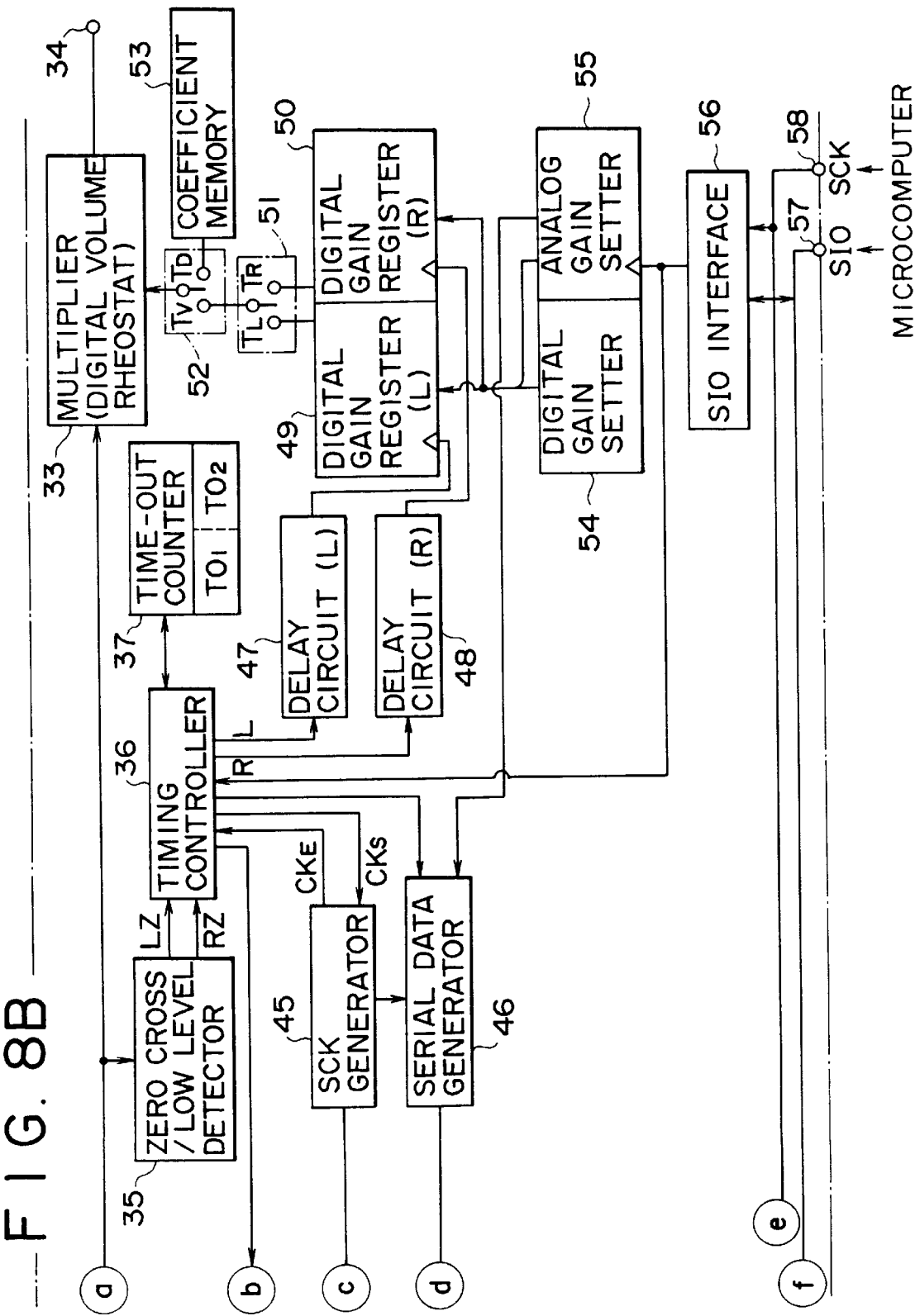

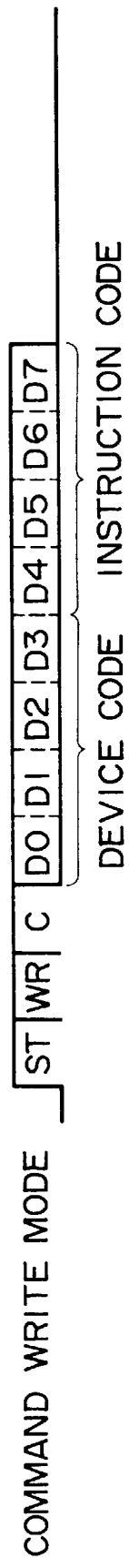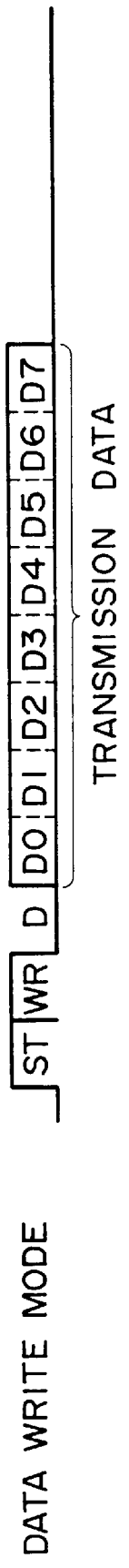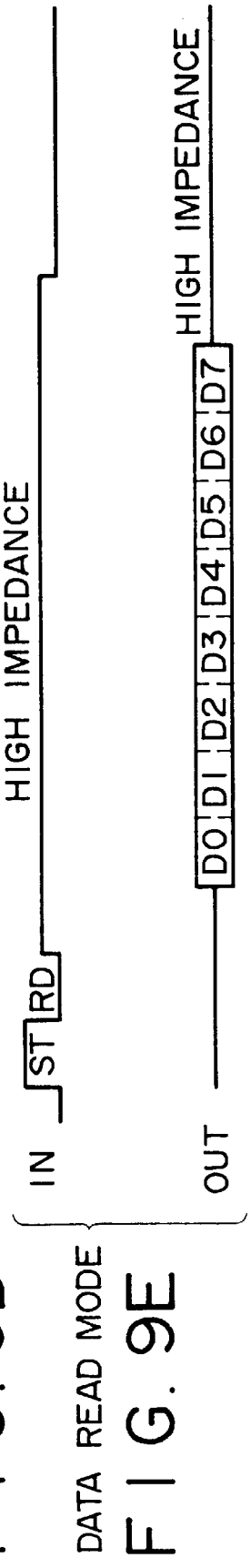
FIG. 9A SCK
FIG. 9B COMMAND WRITE MODE — DEVICE CODE INSTRUCTION CODE
FIG. 9C DATA WRITE MODE — TRANSMISSION DATA
FIG. 9D / FIG. 9E DATA READ MODE — HIGH IMPEDANCE

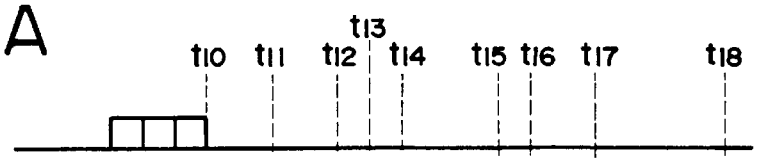
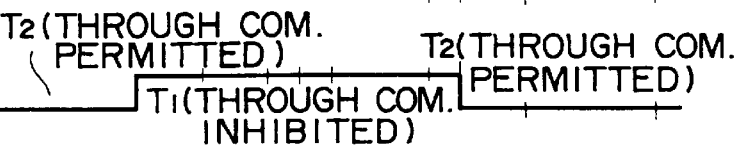
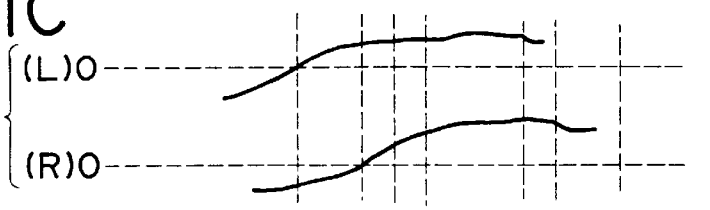
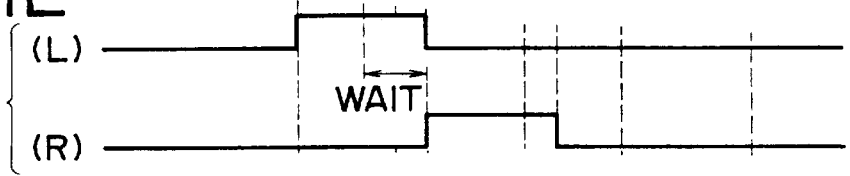
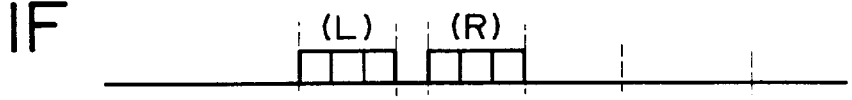
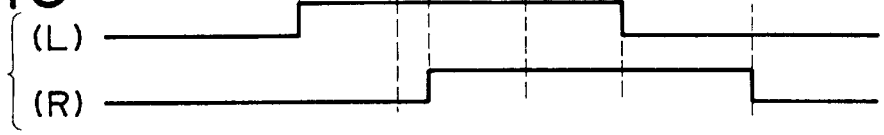
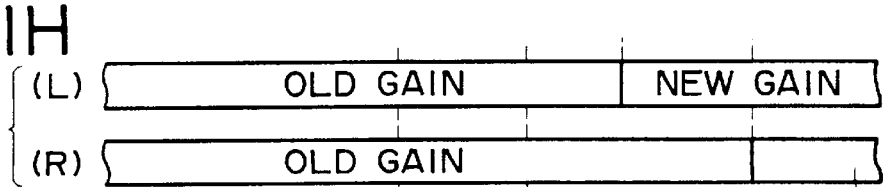
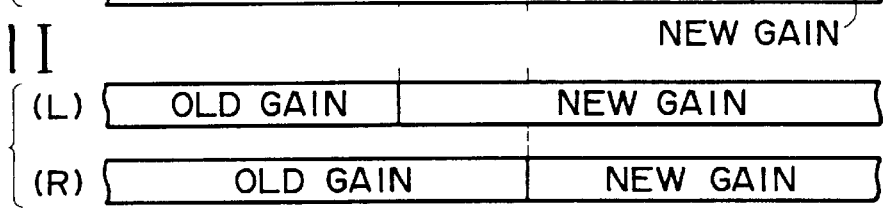

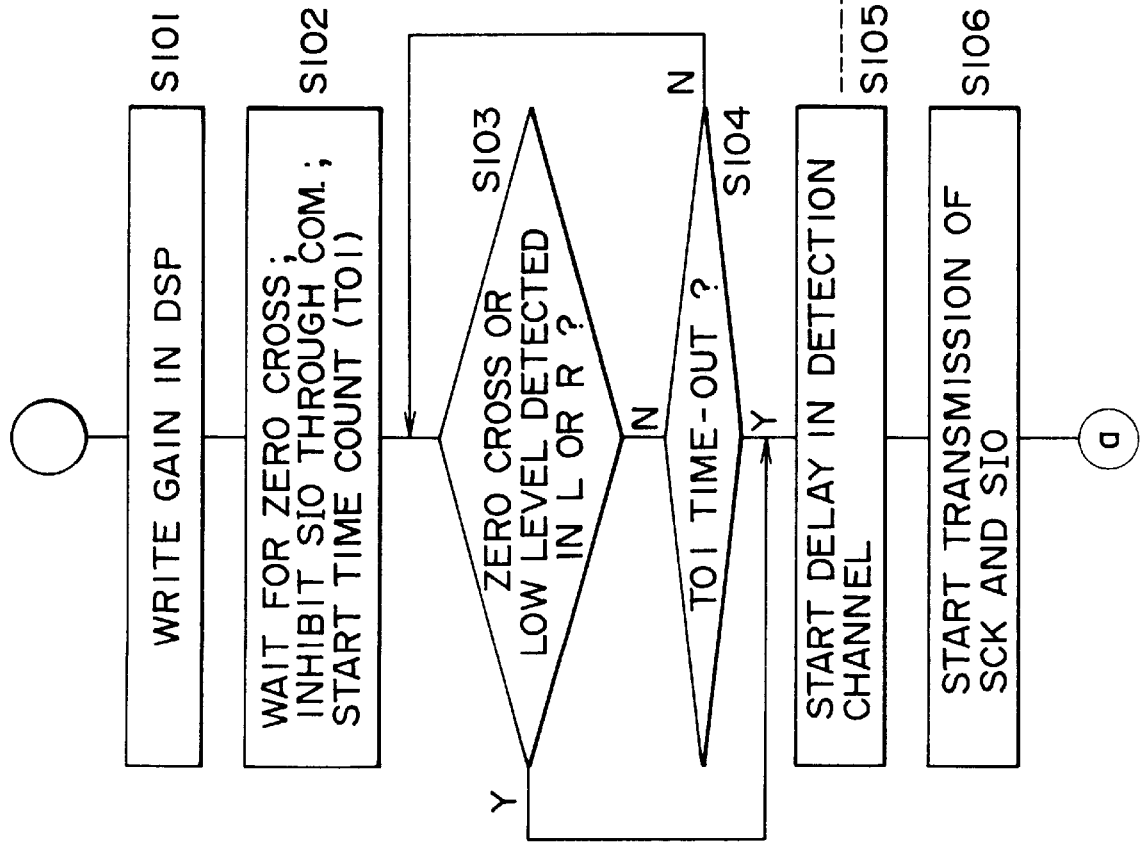

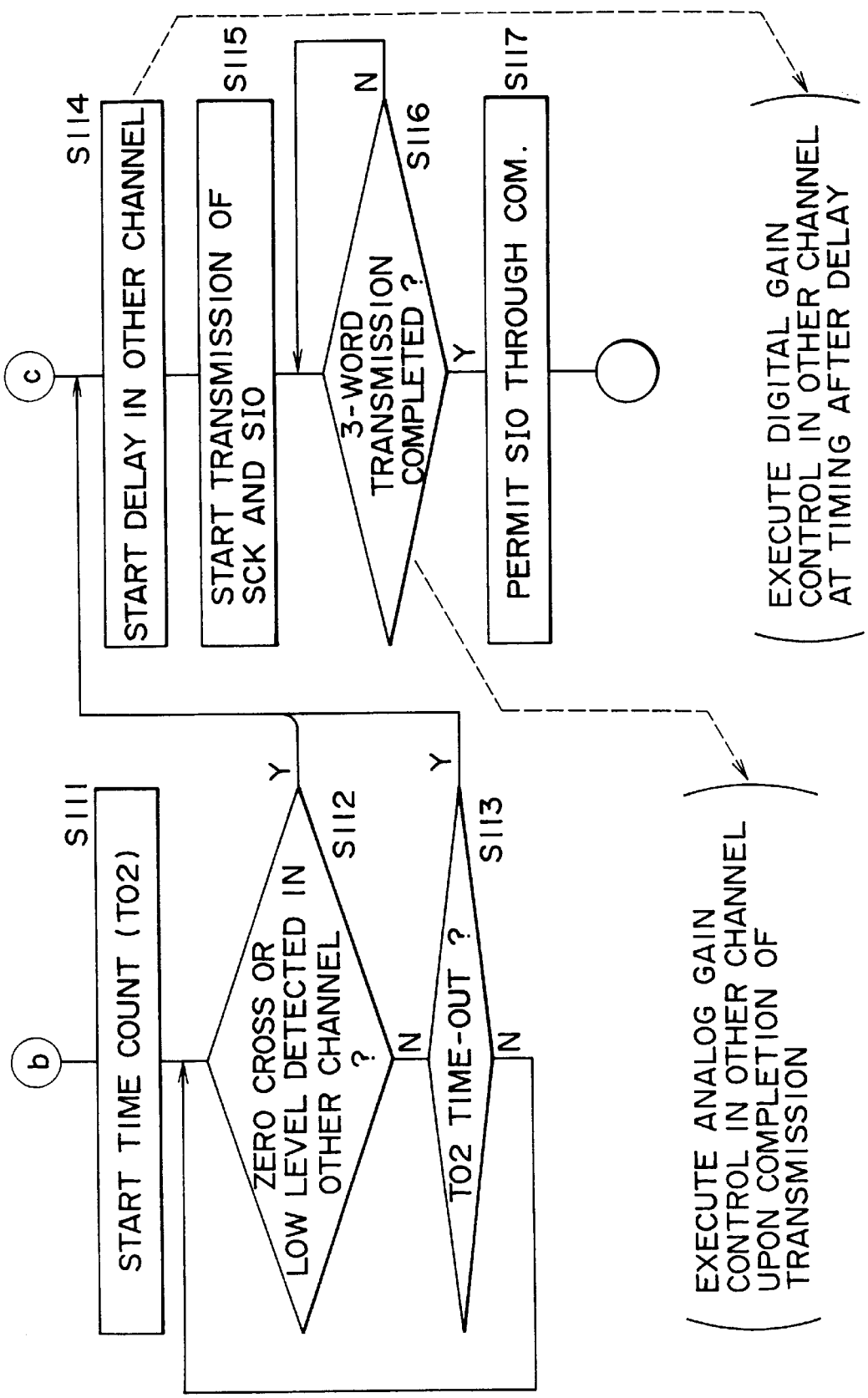

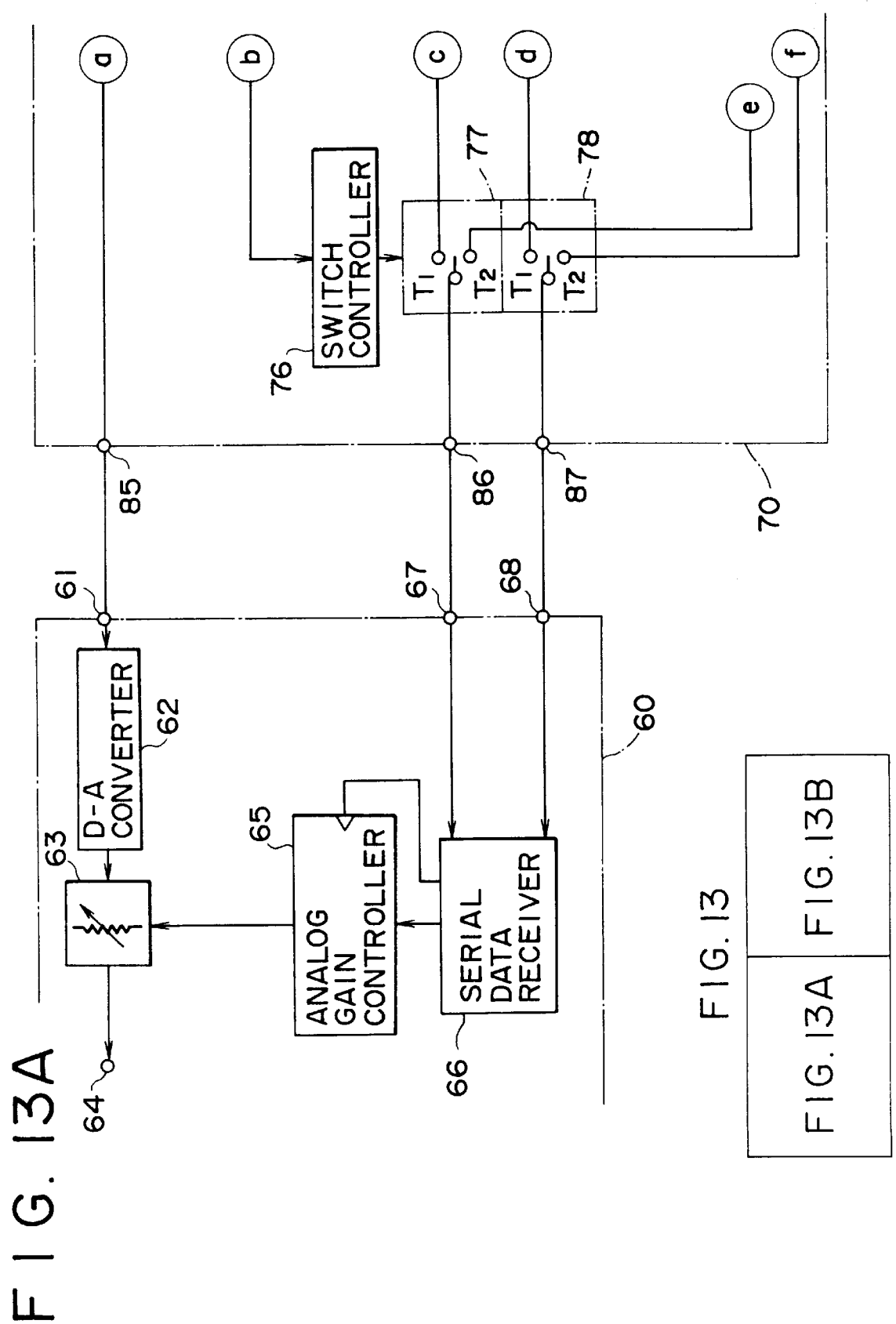

GAIN VARYING DEVICE CAPABLE OF VARYING EACH GAIN OF ANALOG AND DIGITAL SIGNALS

BACKGROUND OF THE INVENTION

The present invention relates to a gain varying device which is capable of adjusting the gain with regard to an audio signal.

In a digital audio recorder or the like, it is necessary to adjust the level of an analog audio signal by an analog volume circuit in a stage anterior to conversion of the analog audio signal into a digital audio signal by an A-D converter.

For digitally controlling the gain in the analog volume circuit from a control unit such as a microcomputer, a 2-dB step resistance network for example is employed as an analog volume circuit.

When the gain is switched in the volume circuit at a point where the signal amplitude is great, there arises a problem in the related art that noise is generated due to the level difference in the waveform. In order to solve this problem, as shown in FIG. 1, a zero-cross detector 105 is provided for an analog audio signal input obtained from a terminal 101, so as to detect the timing when the level of the signal waveform becomes zero.

The analog audio signal is supplied to an analog volume rheostat 102 where predetermined gain control is performed and, after being converted into a digital audio signal in an A-D converter 103, this signal is outputted from a terminal 104. In this case, the gain in the analog volume rheostat 102 is changed by an analog gain controller 106.

A desired value of the gain is set in a gain setter 107 from a main controller consisting of a microcomputer, and the analog gain controller 106 loads the value set in the gain setter 107 while applying, as a trigger, the zero-cross timing detected by the zero-cross detector 105, and then switches the gain of the analog volume rheostat 102.

Thus, it has been customary heretofore to prevent generation of noise by switching the gain at the zero-cross timing of the signal.

In a circuit configuration where the gain is varied automatically as in an AGC (automatic gain control) circuit without any user's manipulation of a volume rheostat, if the gain variation step in the analog volume circuit is great, the sound volume change is rendered extremely unnatural in auditory sense. For this reason, it is necessary to reduce the pitch of the gain variation steps so as to realize proper adjustment of the sound volume to an adequate level with a natural feeling.

However, reduction of the pitch of the gain variation steps causes an increase in the number of resistance elements or analog switches to consequently enlarge the circuit scale.

In view of the above problem, there is known a method of diminishing the pitch of the gain variation steps in total by first executing rough adjustment of the gain in an analog stage and then executing fine adjustment thereof in a digital stage.

As shown in FIG. 2 for example, the gain of an analog audio signal inputted from a terminal 111 is adjusted in an analog volume rheostat 112, and then this analog signal is converted into a digital audio signal in an A-D converter 113. Thereafter the digital audio signal is supplied to a digital volume rheostat 114 for gain adjustment, and then the processed signal is outputted from a terminal 115.

The analog volume rheostat 112 consists of, e.g., a 2-dB step resistance network, so that the signal gain is variable in 2-dB steps by an analog gain controller 116. Meanwhile the digital volume rheostat 114 is realized by a process of multiplication in a DSP (digital signal processor) for example, whereby the gain is rendered variable at a fine step pitch with setting of a coefficient. For example, gain variation can be executed at a 0.25-dB step pitch.

In varying the gain with regard to the audio signal, the main controller sets a desired value thereof in a gain setter 118. The control action is so performed that an analog gain controller 116 varies the gain of the analog volume rheostat 112 by the value of high-order bits, while a digital gain controller 117 varies the gain of the digital volume rheostat 114 by the value of low-order bits.

The digital volume rheostat 114 is enabled to vary the gain at a small pitch of 0.25 dB during the period required for the analog volume rheostat 112 to execute a 2-dB gain variation, whereby the total gain is rendered variable in a 0.25-dB step. More specifically, it becomes possible in the analog volume rheostat 112 to change the sound volume level with a natural feeling without the necessity of increasing the number of resistance elements or analog switches to reduce the variation step pitch.

Practically, however, smooth gain variation has not been realizable heretofore due to the input time difference caused between the analog volume rheostat 112 and the digital volume rheostat 113 by the operation of the A-D converter 113 and so forth, and also because interlocked control for gain variation is impossible at the zero-cross timing.

Assume now that the gain of the analog volume rheostat 112 and that of the digital volume rheostat 114 are varied as shown in FIGS. 3B and 3C respectively for example.

For varying the total gain in 0.25-dB steps, if the gain is raised by 2 dB in the analog volume rheostat 112, it is necessary to lower the gain by 1.75 dB in the digital volume rheostat 114.

However, due to some deviation of the signal input timing or no execution of control for the gain variation timing, differences D are generated in the total gain as shown in FIG. 3A, for example, on the basis of the gain variations in FIGS. 3B and 3C, hence causing noise or unnatural sound volume change.

SUMMARY OF THE INVENTION

It is an object of the present invention to realize satisfactory gain adjustment in a gain varying signal system for controlling each gain of an analog signal and a digital signal.

According to one aspect of the present invention, there is provided a gain varying device which comprises an analog gain varier capable of varying the gain of an input analog signal; a zero-cross detector for detecting a zero cross in the input analog signal; an analog-digital converter for converting into a digital signal the analog signal outputted from the analog gain varier; a digital gain varier capable of varying the gain of the digital signal converted by the analog-digital converter; and a controller for controlling the gain variation timing of the analog gain varier and that of the digital gain varier in response to the detected zero-cross timing obtained from the zero-cross detector.

According to another aspect of the present invention, there is provided a gain varying device which comprises an analog gain varier capable of varying the gain of an input analog signal; an analog-digital converter for converting into a digital signal the analog signal outputted from the analog gain varier; a zero-cross detector for detecting a zero cross or a vicinity thereof in the digital signal outputted from the analog-digital converter; a digital gain varier capable of varying the gain of the digital signal outputted from the analog-digital converter; a transferrer for transferring predetermined communication data to the analog gain varier and the digital gain varier; and a controller for permitting or inhibiting transfer of the communication data from the transferrer to the analog gain varier in response to the timing of the detected zero cross or vicinity thereof obtained from the zero-cross detector.

And according to a further aspect of the present invention, there is provided a gain varying device which comprises a zero-cross detector for detecting a zero cross or a vicinity thereof in an input digital signal; a digital-analog converter for converting the input digital signal into an analog signal; an analog gain varier capable of varying the gain of the analog signal converted by the digital-analog converter; and a controller for selectively controlling the gain variation timing of the analog gain varier in response to the output signal of the zero-cross detector.

The above and other features and advantages of the present invention will become apparent from the following description which will be given with reference to the illustrative accompanying drawings.

BRIEF DESCRIPTION OF THE DRAWINGS

FIG. 5 is a table showing the pitch of gain variation steps and coefficients thereof in the digital gain varier;

FIG. 6A graphically shows variations in the output signal of the gain varying device in FIG. 4;

FIG. 6B graphically shows the pitch of gain variation steps in the analog gain varier;

FIG. 6C graphically shows the pitch of gain variation steps in the digital gain varier;

FIG. 8 is a block diagram of a second embodiment of the present invention;

FIG. 9A shows a serial clock signal;

FIG. 9B shows a command signal to be transferred;

FIG. 9C shows a data signal to be transferred;

FIG. 9D shows an input data signal in a read mode;

FIG. 9E shows an output data signal in a read mode;

FIG. 11A shows a gain write instruction signal to a DSP 30 in FIG. 8;

FIG. 11B shows a control signal to switches 41 and 42;

FIG. 11C shows output signals of two channels from a HPF 32 in FIG. 8;

FIG. 11D shows zero-cross signals LZ and RZ of two channels outputted from the HPF 32;

FIG. 11E shows timing control signals of two channels for serial transfer data;

FIG. 11F shows an output signal to be serial transferred;

FIG. 11G shows timing signals of two channels for the digital gain varier;

FIG. 11H shows switching timing in two channels for the digital gain varier;

FIG. 11I shows switching timing in two channels for the analog gain varier;

DESCRIPTION OF THE PREFERRED EMBODIMENTS

Hereinafter first to third embodiments of the present invention will be described.

<First Embodiment>

Figure 4:
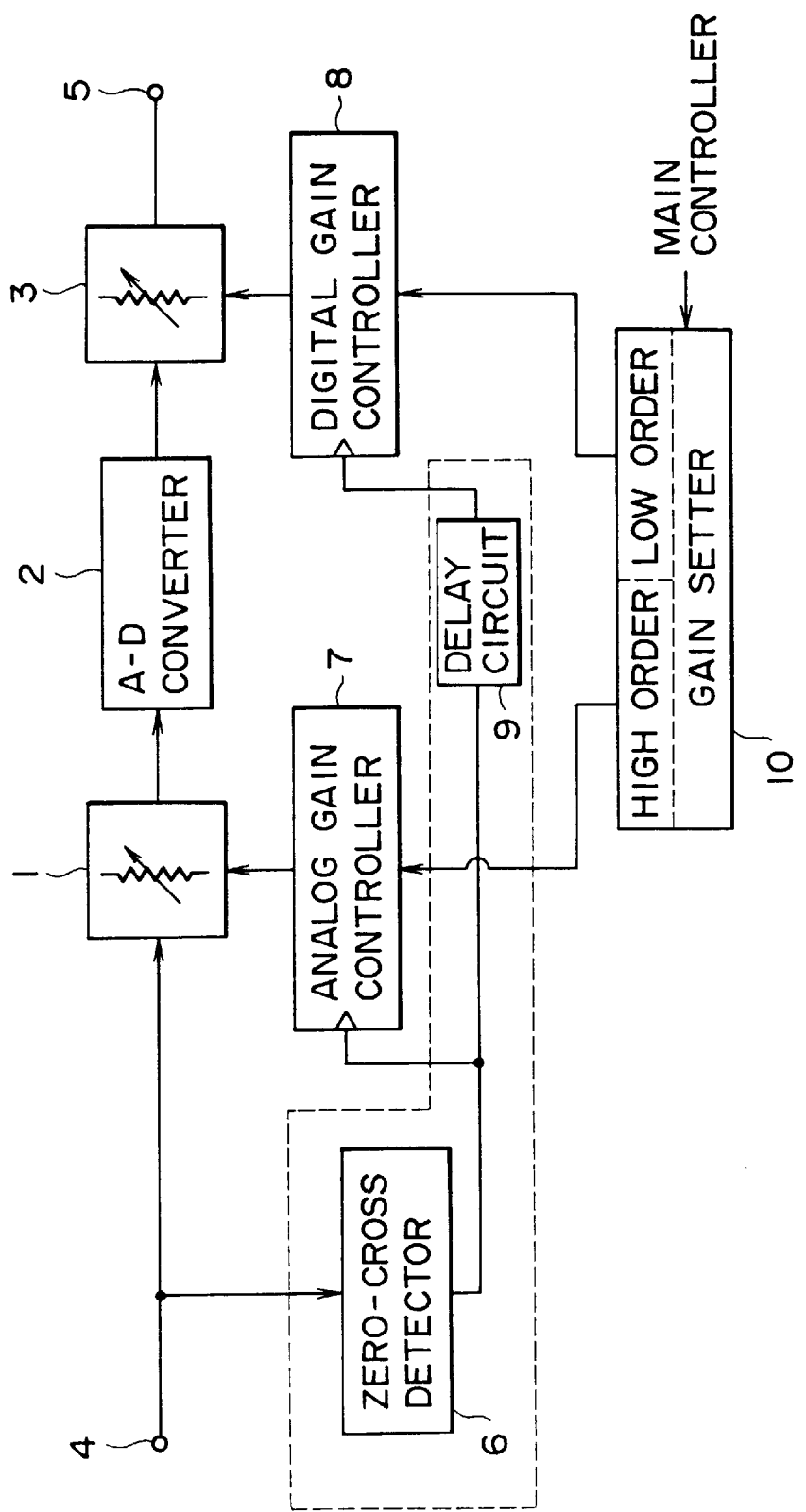
FIG. 4 is a block diagram of a gain varying device representing a first embodiment of the present invention.

The circuit configuration of a first embodiment is shown in FIG. 4.

It is supposed here that all component blocks in FIG. 4 are disposed in one and the same IC.

An analog audio signal is inputted to a terminal 4. The analog audio signal thus inputted is supplied to a zero-cross detector 6 and an analog volume rheostat 1 consisting of a variable resistance network.

The analog audio signal is given a required gain in the analog volume rheostat 1 and then is converted into a digital audio signal in an A-D converter 2. Thereafter the digital audio signal is supplied to a digital volume rheostat 3 consisting of a digital signal processor (DSP), where the signal is given a required gain through predetermined calculation and then is outputted from a terminal 5.

The gain of the analog volume rheostat 1 is varied by an analog gain controller 7, while the gain of the digital volume rheostat 3 is varied by a digital gain controller 8.

Desired values of the gains are set in a gain setter 10 by a main controller consisting of a microcomputer or the like. And a high-order one of the set values represents an analog gain, while a low-order one thereof represents a digital gain. These values are loaded in the analog gain controller 7 and the digital gain controller 8 respectively, whereby the gain of the analog volume rheostat 1 and that of the digital volume rheostat 3 are controlled.

Upon detection of the zero-cross timing of the analog audio signal inputted from the terminal 4, the zero-cross detector 10 outputs a load signal to the analog gain controller 7. Accordingly, the analog gain controller 7 loads the high-order value, which is set in the gain setter 10, at the zero-cross timing of the audio signal and switches the gain of the analog volume rheostat 1, thereby executing the gain switching operation at the zero-cross timing in the analog volume rheostat 1.

The load signal outputted from the zero-cross detector 6 is supplied via a delay circuit 9 to the digital gain controller 8. The delay circuit 9 gives to the load signal a delay corresponding in amount to the signal delay caused by the process in the A-D converter 2. More specifically, this amount of the delay corresponds to the delay of the input timing of the signal to the analog volume rheostat 1 and the digital volume rheostat 3. The delay circuit 9 can be composed of a shift register or a counter.

The digital gain controller 8 loads the low-order value, which is set in the gain setter 10, in response to the load signal supplied via the delay circuit 9, and then switches the gain of the digital volume rheostat 3.

The analog volume rheostat 1 is so constructed as to be capable of varying the gain in, e.g., 2-dB steps.

Figure 1:
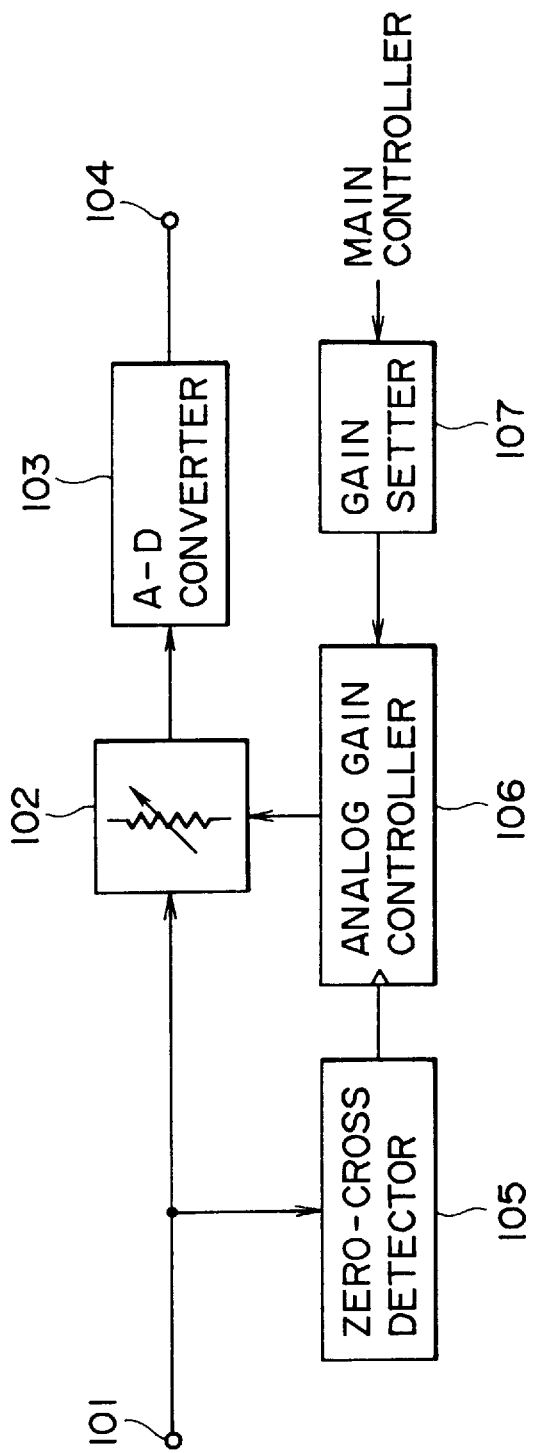
FIG. 1 is a block diagram of a related art gain varying device according to the related art.
Figure 2:
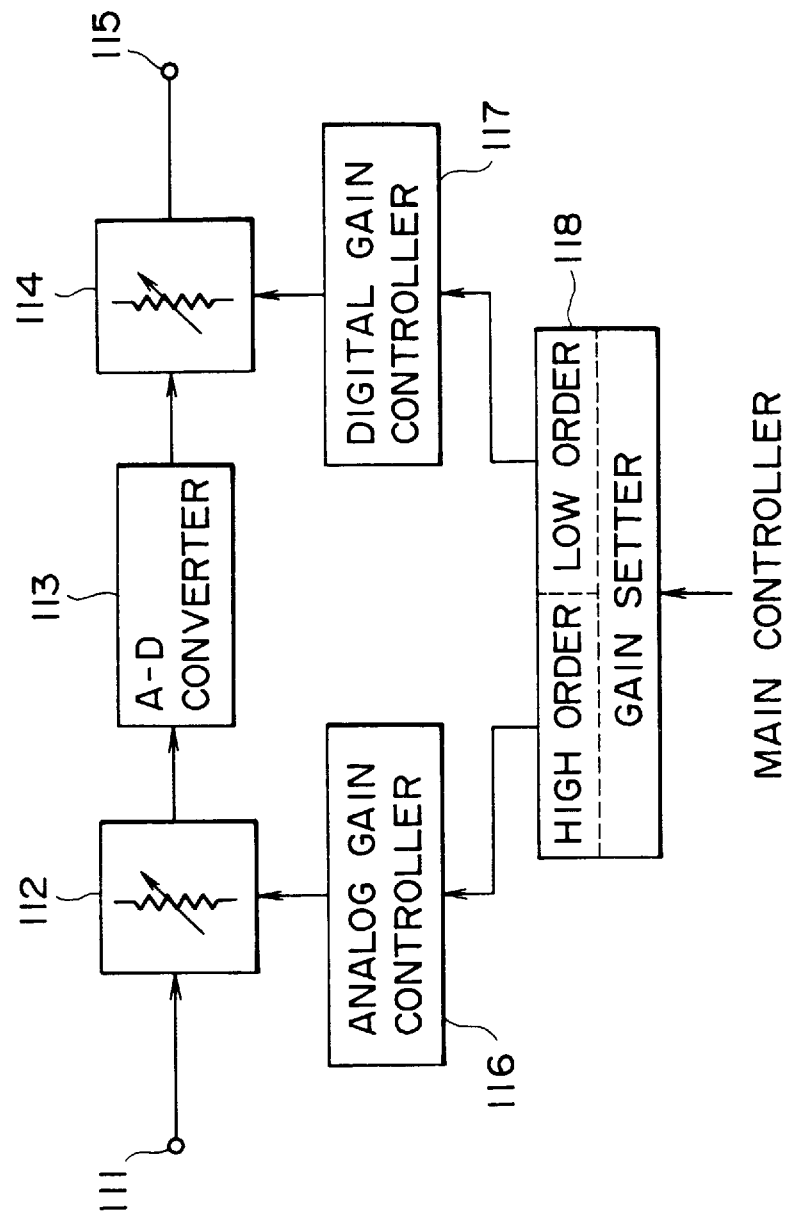
FIG. 2 is a block diagram of a related art analog and digital gain varying device according to the related art.

The analog volume rheostat 1 is realized to serve as a digital multiplication processor for, e.g., 10-bit coefficient word length, wherein the gain is variable at a fine step pitch in accordance with setting of coefficients. It is supposed here that the gain is variable at a pitch of 0.25 dB step. In this embodiment, a total of eight digital gains are obtainable in top-justified expression as shown in the table of FIG. 5. The maximum positive gain expressible with 10 bits is "7FCh" (where "h" denotes hexadecimal notation), which is slightly smaller than a 1-fold value. Therefore, a 0.5-fold value =400h is determined as 0 dB, and it is shifted up by 1 bit after a multiplication to become exactly a 1-fold value. As obvious from a comparison of FIGS. 2 and 4, the components enclosed with a one-dot chained line constitute a novel portion.

Suppose now that, in the above gain varying device, it is desired to gradually raise the total gain in 0.25-dB steps as shown in FIG. 6A. In this case, at the variation timing after a change of the digital gain from −0.25 dB to 0 dB as shown in FIG. 6C, it is necessary to raise the analog gain by 1 step (2 dB) while lowering the digital gain to −0.75 dB, as shown in FIGS. 6B and 6C.

Figure 3A:
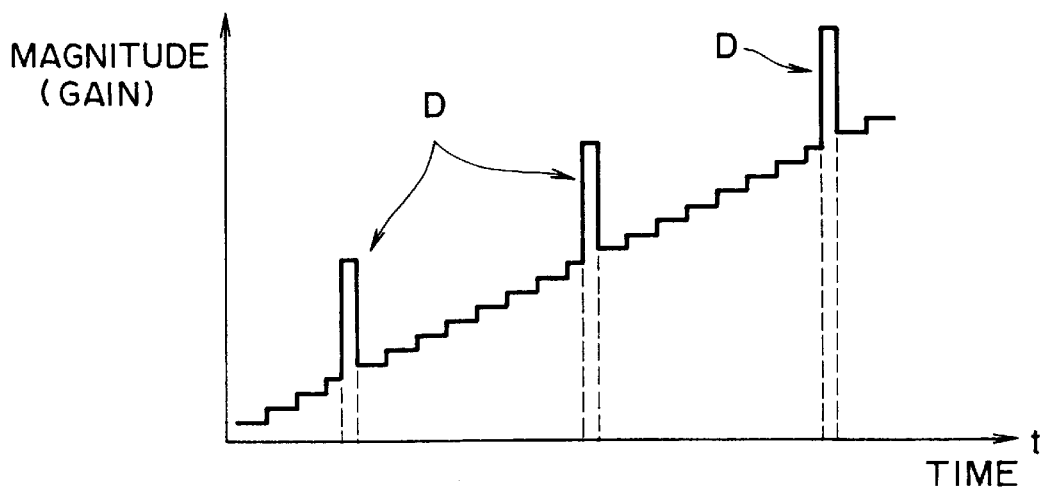
FIG. 3A graphically shows variations in the output signal of the related art gain varying device in FIG. 2.
Figure 3B:
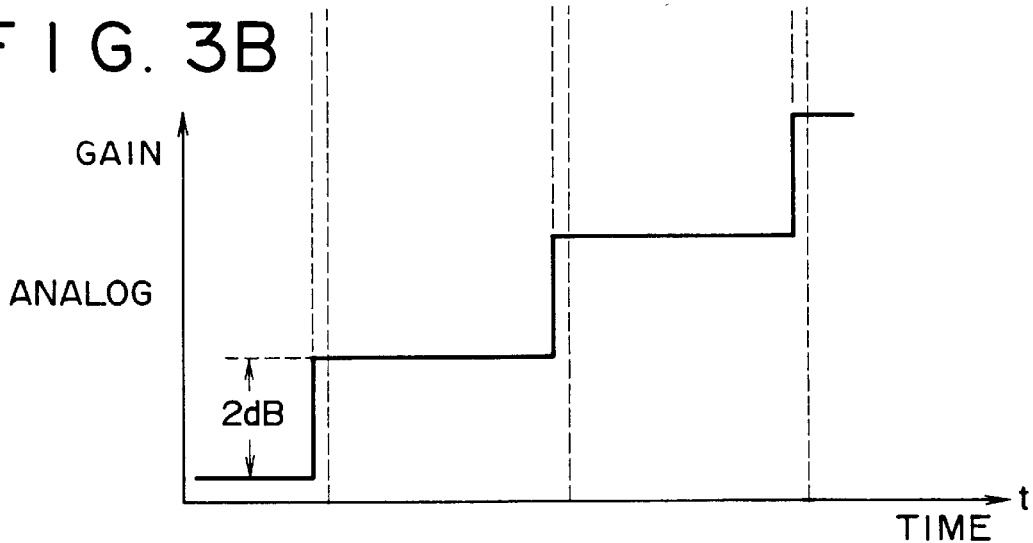
FIG. 3B graphically shows the pitch of gain variation steps in the analog gain varier.
Figure 3C:
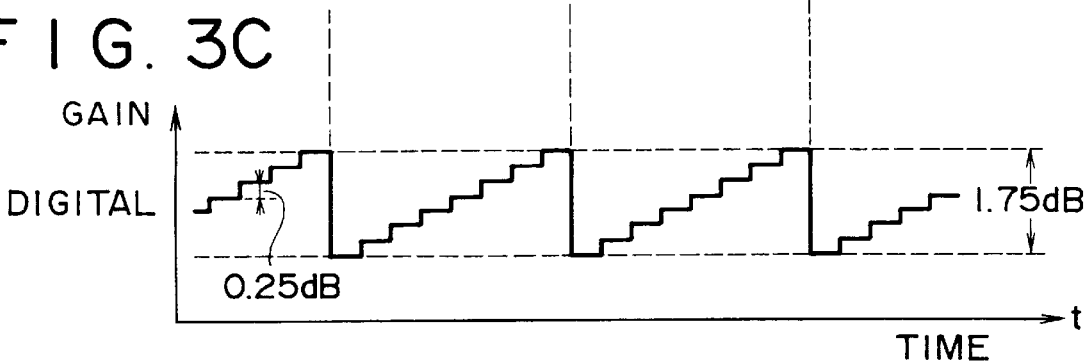
FIG. 3C graphically shows the pitch of gain variation steps in the digital gain varier.

More specifically, with regard to the input signal, a 1-step increase of the analog gain and a decrease of the digital gain to −0.75 dB are performed simultaneously to thereby raise the total gain exactly in 0.25 dB steps, as shown in FIG. 6A. That is, it becomes possible to prevent generation of the difference D shown in FIG. 3A.

This embodiment is so contrived as to be capable of realizing such gain varying operation, which is shown in FIGS. 7A to 7F.

Figure 7A:
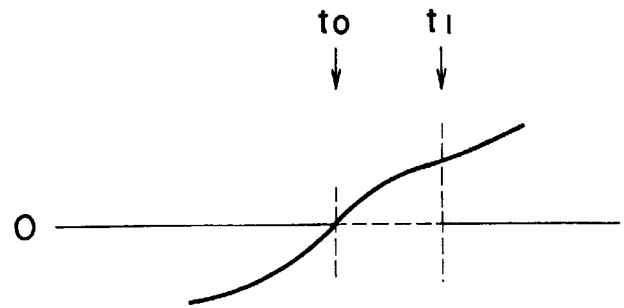
FIG. 7A shows the waveform of an analog input signal.
Figure 7B:
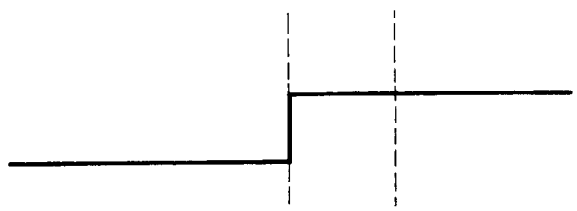
FIG. 7B shows a zero-cross output signal detected by a zero-cross comparator from the analog input signal.
Figure 7C:
FIG. 7C shows an edge output signal obtained by converting the zero-cross output signal.

Assuming that the analog audio signal inputted to the terminal 4 is such as shown in FIG. 7A, the zero-cross detector 6 detects a zero-cross timing at time point $t_0$ as shown in FIGS. 7B and 7C. In an exemplary case where the zero-cross detector 6 consists of a comparator having a comparison reference of 0V and an edge detection pulse generator for detecting the edge of the comparator output, then the output of the comparator rises at time point $t_0$ as shown in FIG. 7B, and an edge detection pulse is outputted from the edge detection pulse generator at time point $t_0$ as shown in FIG. 7C.

Figure 7D:
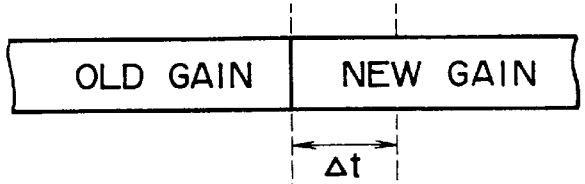
FIG. 7D shows a timing to selectively switch the old gain and the new gain in the analog gain varier.

The edge detection pulse is used as a load signal for the analog gain controller 7. At time point $t_0$, this controller 7 loads the high-order value set in the gain setter 10, and then varies the gain of the analog volume rheostat 1 in a 2-dB step. That is, the gain of the analog volume rheostat 1 is switched at time point $t_0$ as shown in FIG. 7D.

Figure 7E:
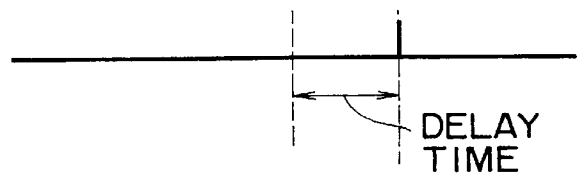
FIG. 7E shows a switching timing signal in the digital gain varier.
Figure 7F:
FIG. 7F shows a timing to selectively switch the old gain and the new gain in the digital gain varier.

Then, the edge detection pulse is delayed by a delay circuit 9 at time point $t_0$ shown in FIG. 7C, and the delayed pulse is supplied to the digital gain controller 8 at time point $t_1$ as shown in FIG. 7E. The output of this delay circuit 9 is used as a load signal for the digital gain controller 8, and the delay time $\Delta t$ corresponds to the processing time of the A-D converter 2. Therefore, the digital gain controller 8 loads the low-order value set in the gain setter 10 at time point $t_1$, later by the delay time $\Delta t$ than the analog gain controller 7, and then varies the gain of the digital volume rheostat 3. Consequently, the gain of the digital volume rheostat 3 is switched at time point $t_1$ as shown in FIG. 7F.

Due to such control of the time points to vary the two gains, it follows that, in respect of the input signal, the analog gain and the digital gain are switched at the same zero-cross timing, whereby smooth switching can be realized in the total gain without generation of the difference shown in FIG. 6A. As a result, no noise is generated at the time of switching the gains.

Further, the gain is varied at a pitch of 0.25-dB steps and at a small interval in the digital volume rheostat 3 during the period in which the analog volume rheostat 1 executes a 2-dB gain variation, so that the operation of varying the total gain can be performed at a small pitch of 0.25-dB variation steps, hence realizing satisfactory variations of the sound volume level with a natural feeling. In addition, it becomes possible to eliminate the necessity of increasing the number of resistance elements or analog switches in the analog volume rheostat 1 for reducing the pitch of variation steps.

<Second Embodiment>

The circuit configuration of a second embodiment is shown in FIG. 8.

In FIG. 8, a gain varying device consists of an analog signal processing IC 20 and a digital signal processing IC (DSP: digital signal processor) 30.

An analog gain is switched in the analog signal processing IC 20, while a digital gain is switched in the DSP 30, and control of such gain switching is performed through serial data communication.

More specifically, a microcomputer (main controller) sets the analog gain and the digital gain in the DSP 30 through serial data communication, and then, in response to detection of a zero-cross, the DSP 30 sets the analog gain in the analog signal processing IC 20 through serial data communication, thereby realizing interlocked variation control of the digital gain and the analog gain.

First, a brief description will be given on the serial data communication performed herein.

The serial data communication is based on a two-wire peripheral chip control system, wherein a microcomputer serves as a master to output a clock signal SCK, and a peripheral IC executes an operation of reading and/or writing serial data with the microcomputer by the use of an interactive serial communication line.

The clock signal SCK and the serial data are shown in FIGS. 9A to 9D.

For the serial data, there are set three signal modes such as a command write mode, a data write mode and a data read mode, as shown in FIGS. 9B, 9C and 9D respectively.

In each of such three modes, a top bit is used as a start bit (ST), and a second bit is used as a write/read identification bit (WR/RD). Further in the write mode, an identification bit for identifying the command write mode of FIG. 9B or the data write mode of FIG. 9C is provided in a third bit as a command (C)/data (D).

In the command write mode of FIG. 9B including eight bits from D0 to D7, four bits of D0–D3 are used as a device code, and four bits of D4–D7 as an instruction code. The device code serves to designate a device such as an IC in the opposite communication equipment, and an instruction code used as an actual command is written in the IC or the like designated by the device code. Some kinds of commands are set as an instruction code correspondingly to the values of the 4 bits.

In the data write mode of FIG. 9C, eight bits of D0–D7 are used for transmission data.

In the data read mode of FIG. 9D, the third and subsequent bits are turned to high impedance, and during this period, data are read from the IC in the opposite communication equipment, as shown in FIG. 9E.

The microcomputer is capable of outputting a processing command to the DSP 30 through serial data communication and also giving an instruction to the analog signal processing IC 20 to execute variation of the analog gain and so forth. However, in interlocked control of the digital gain and the analog gain, the microcomputer instructs the DSP 30 to vary the analog gain and the digital gain or indicates the values thereof. Then the DSP 30 instructs the analog signal processing IC 20 through serial data communication to execute the operation of varying the analog gain and indicates the analog gain value.

Figure 10:
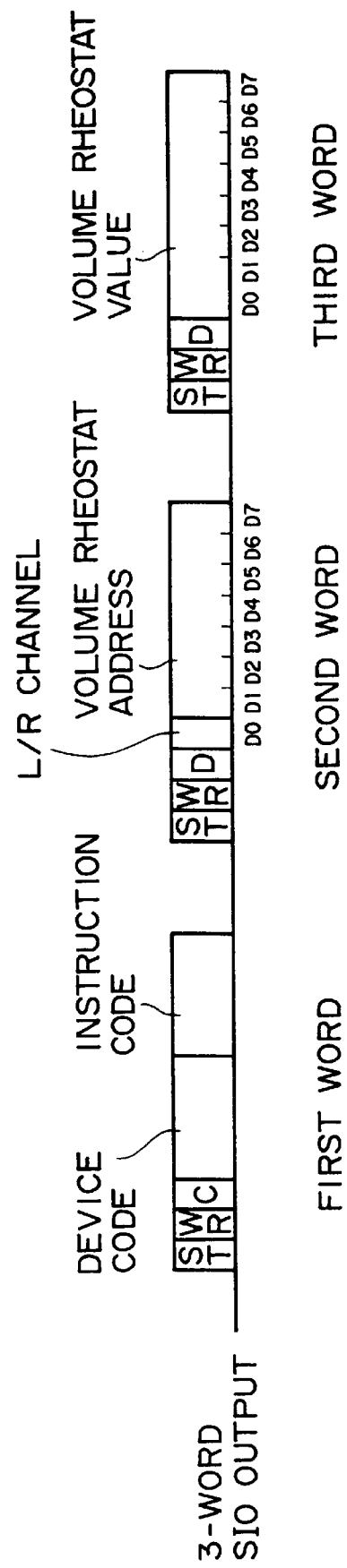
FIG. 10 shows a format of transfer data outputted to a serial I/O interface.

Serial data communication from the DSP 30 to the analog signal processing IC 20 for gain control is performed in three words as shown in FIG. 10.

The first word is processed in the command write mode, wherein the analog signal processing IC 20 is designated by the device code, and the instruction code signifies that the next word is an address.

The second and third words are processed in the data write mode. First in the second word, a bit D0 is used for discriminating between the L (left) channel and the R (right) channel of a stereo audio signal, and subsequent seven bits of D1–D7 are used for sending an address where the value of the volume rheostat is to be written. And in the third word, eight bits of D0–D7 are used for sending the value of the volume rheostat, i.e., the value of the analog gain to be set.

The configuration of the gain varying device consisting of the analog signal processing IC 20 and the DSP 30 will now be described below with reference to FIG. 8.

Stereo analog audio signals of left and right channels are inputted to a terminal 21. The left and right analog audio signals thus inputted are supplied to an analog volume rheostat 22. The analog audio signal of each channel is supplied to the analog volume rheostat 22 where required gain adjustment is executed, and then the gain-adjusted signal of each channel is converted into a digital audio signal by an A-D converter 23. Thereafter the audio signals of the left and right channels are outputted by time division multiplexing from a terminal 24.

The gain of the analog volume rheostat 22 is varied by an analog gain controller 25, and a desired value of the analog gain is set in a serial data receiver 26 through serial data communication from the DSP 30. A clock signal for the serial data communication is inputted to a terminal 27, while words for the serial data communication, such as those shown in FIG. 10, are inputted to a terminal 28.

The analog gain controller 25 loads the value of the analog gain in accordance with the three-word serial data written in the serial data receiver 26, and controls the gain of the analog volume rheostat 22.

The digital audio signal outputted from the terminal 24 of the analog signal processing IC 20 is inputted to a terminal 31 of the DSP 30.

In the DSP 30, the digital audio signal inputted through time division is first processed via a high pass filter 32 and then is supplied to a multiplier 33. Subsequently the multiplier 33 executes multiplications for various processes. When it functions as a digital volume rheostat, the gain value for a multiplication is supplied thereto via a contact $T_V$ of a switch 52. Meanwhile, when some other multiplication is to be executed for a process of an over-sampling filter for example, a predetermined coefficient is supplied from a coefficient memory 53 via a contact $T_D$ of the switch 52.

The signal processed in the multiplier 33 with addition of the gain and so forth is then outputted from a terminal 34. Since the function of the multiplier 33 as a digital volume rheostat is controlled in this embodiment, hereinafter the multiplier 33 will be mentioned as a digital volume rheostat 33.

A clock signal SCK and data words for serial data communication from a microcomputer are inputted to the DSP 30 via terminals 58 and 57.

In the DSP 30, commands and indicated gain values included in the contents of serial data communication are taken in via an interface 56.

And subsequently operation of a timing controller 36 for interlocked gain variation is started in response to the gain variation command.

The indicated digital gain value and analog gain value are written in a digital gain setter 54 and an analog gain setter 55, respectively.

The left-channel digital gain value and the right-channel digital gain value set in the digital gain setter 54 are loaded in a left-channel gain register 49 and a right-channel digital gain register 50 respectively in response to load signals supplied from the timing controller 36 via delay circuits 47 and 48.

When the left channel signal is inputted to the digital volume rheostat 33 during the digital gain control, the switch 51 is connected to the contact $T_L$ while the switch 52 is connected to the contact $T_V$, so that the gain of the digital volume rheostat 33 is controlled in accordance with the value loaded in the left-channel digital gain register 49.

Meanwhile, when the right channel signal is inputted to the digital volume rheostat 33, the switch 51 is connected to the contact $T_R$ while the switch 51 is connected to the contact $T_V$, so that the gain of the digital volume rheostat 33 is controlled in accordance with the value loaded in the right-channel digital gain register 50.

The left-channel analog gain value and the right-channel analog gain value set in the analog gain setter 55 are supplied to a serial data generator 46, which then generates the three-word communication data such as those shown in FIG. 10.

In the case of serial data communication performed from the DSP 30 to the analog signal processing IC 20 for interlocked control of the digital and analog gains, switches 41 and 42 are connected to the contacts $T_1$ thereof respectively.

Accordingly, a clock signal SCK generated from a clock generator 45 and three-word data generated from the serial data generator 46 are outputted respectively from terminals 43 and 44 of the DSP 30 to the analog signal processing IC 20.

In any mode other than the interlocked gain control, normally the switches 41 and 42 are connected to the contacts $T_2$ thereof respectively, whereby direct serial data communication is rendered possible from the microcomputer to the analog signal processing IC 20. Consequently, in varying merely the analog gain alone for example, it becomes possible for the microcomputer to directly instruct the analog signal processing IC 20 to vary the gain.

In the DSP 30, the output of a high pass filter 32 is supplied also to a zero-cross detector 35.

The zero-cross detector 35 detects a zero-cross timing of each of the left and right digital audio signals, and then outputs zero-cross detection signals LZ and RZ of the left and right channels to the timing controller 36.

Further, even when the signal is not exactly at its zero level, the zero-cross detector 35 detects, within a predetermined range, if the signal is at any level proximate to its zero level and then outputs zero-cross detection signals LZ and RZ in such a case as well. More specifically, if the signal is at a sufficiently low level within a certain range, it is regarded as a zero cross.

The timing controller 36 controls various timings for varying the analog and digital gains in accordance with the gain variation commands obtained from the microcomputer through serial data communication and the zero-cross detection signals LZ and RZ from the zero-cross detector 35.

Serial data communication is performed from the DSP 30 to the analog signal processor 20 to execute interlocked control of the analog and digital gains. For this purpose, the timing controller 36 sends, at a predetermined timing, a clock start control signal $CK_S$ which instructs a clock generator 45 to start output of a clock signal SCK. Further the timing controller 36 instructs a serial data generator 46 to generate three-word data such as those shown in FIG. 10.

Upon completion of the serial data communication, an end signal $CK_E$ is transmitted from the clock generator 45 to the timing controller 36.

During the serial data communication from the DSP 30 to the analog signal processor 20, a switch control 39 is so instructed as to connect the switches 41 and 42 to the contacts $T_1$ respectively, so that if there occurs transmission of direct communication from the microcomputer to the analog signal processing IC 20, connection of the switches 41 and 42 to the contacts $T_2$ is inhibited, i.e., direct communication is inhibited.

Further the timing controller 36 generates, at a predetermined timing, load signals for the left-channel digital gain register 49 and the right-channel digital gain register 50. Then the load signals are supplied via delay circuits 47 and 48 to the left-channel digital gain register 49 and the right-channel digital gain register 50.

In response to a trigger from the timing controller 36, a time-out counter 37 counts timers TO1 and TO2. The count-up data of the timers TO1 and TO2 are supplied to the timing controller 36.

The interlocked control operation performed for the analog and digital gains in the gain varying device of the above configuration will be described below with reference to FIGS. 11A to 11I and FIG. 12. FIGS. 11A to 11I are timing charts of signals in an example of the interlocked control operation for the analog and digital gains, and FIG. 12 is a flow chart showing the interlocked gain varying operation performed principally under control of the timing controller 36.

Figure 12B:
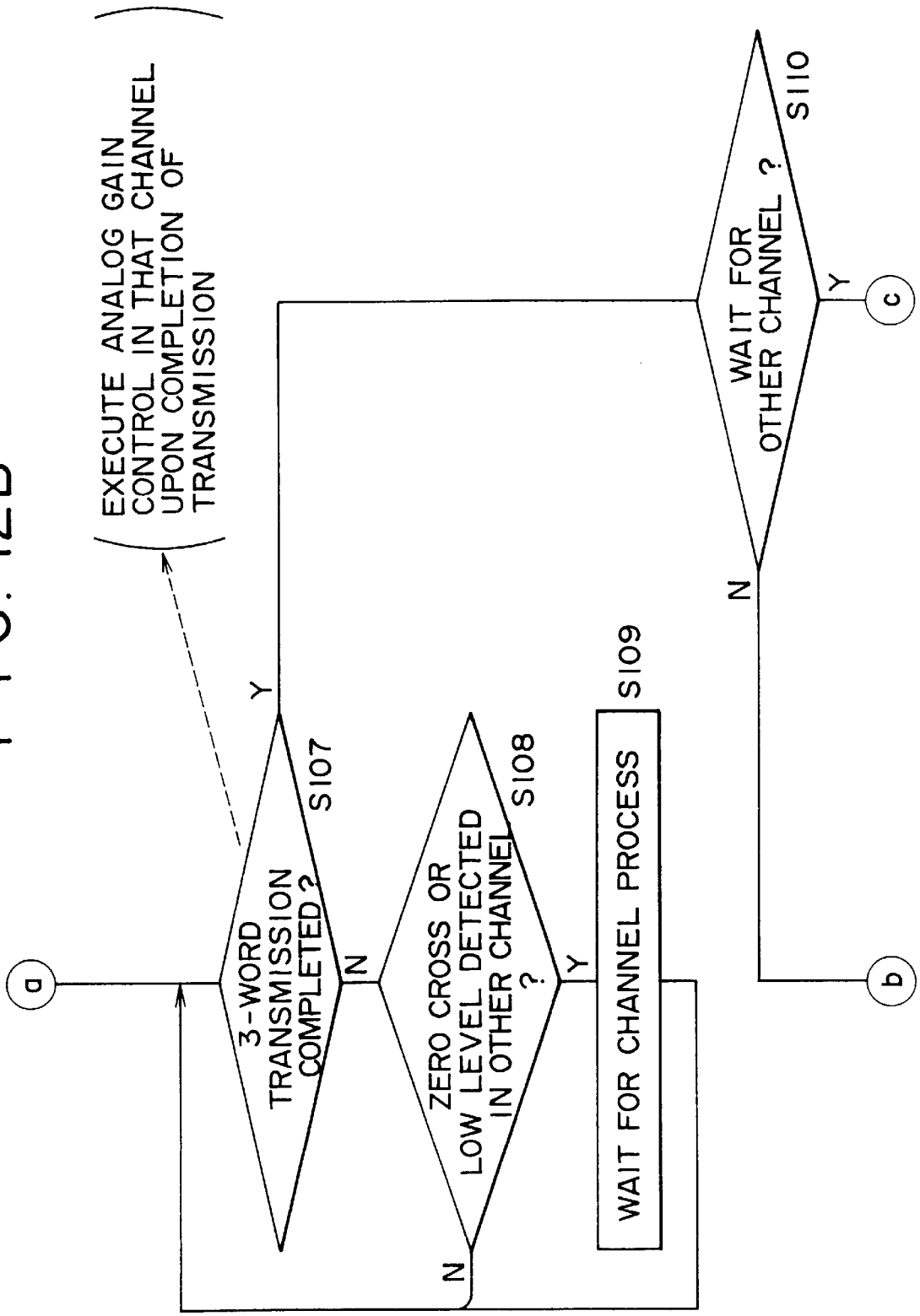
FIG. 12 is a flowchart relative to gain switching control.

As shown at step S101 in FIG. 12, the interlocked gain variation control is started with the setting of gain values through serial data communication from the microcomputer. The microcomputer sets the respective gains in the digital gain setter 54 and the analog gain setter 55. And in response to input of such communication to the timing controller 36, at step S102, the timing controller 36 is placed in its standby state to wait for zero-cross detection signals (LZ, RZ) from the zero-cross detector 35, and simultaneously the switch controller 39 is so instructed as to connect the switches 41 and 42 to the contacts $T_1$, thereby inhibiting direct communication (through communication) from the microcomputer to the analog signal processing IC 20. And the time-out counter 37 is actuated to start counting the timer TO1.

At step S103 in FIG. 12, the timing controller 36 stands by to wait for detection of a zero level or a low level relative to either of the left and right channels from the zero-cross detector 35.

FIG. 11A shows serial data communication from the microcomputer to the DSP 30 for writing the gains, and upon completion of this communication at time point $t_{10}$, the switches 41 and 42 are connected to the contacts $T_1$ as shown in FIG. 11B.

Thereafter the timing controller 36 stands by to wait for detection of a zero level or a low level relative to the digital audio signal of FIG. 11C from the high pass filter 32.

Suppose now that a zero-level or low-level detection signal LZ of the left channel is supplied at time point $t_{11}$ from the zero-cross detector 35 to the timing controller 36, as shown in FIG. 11D.

Then the process proceeds from step S103 to step S105.

In case the count of time TO1 is brought to a time-out while neither a zero level nor a low level is detected from any of the left and right channels, the process forcibly proceeds from step S104 to S105.

At step S105, a load signal is generated with regard to one channel where a zero-cross has been detected, and then the load signal is outputted to the relevant delay circuit (47 or 48).

In the example of FIG. 11, first a load signal of the left channel is generated in response to the detection signal LZ and then is supplied to the delay circuit 47. In FIG. 11G, an input to the delay circuit 47 is expressed as a rise at time point $t_{11}$.

Subsequently at step S106, the timing controller 36 enables the clock generator 45 and the serial data generator 46 to start communication to the analog signal processing IC 20.

As shown in FIG. 11E, first the communication data relative to the left channel begin to be transferred at time point $t_{11}$. More specifically, the clock generator 45 starts to output a clock signal SCK, while the serial data generator 46 generates three-word communication data, such as those shown in FIG. 10, by using the analog gain value held in the analog gain setter 55, and then executes the three-word communication output relative to the left channel as shown in FIG. 11F.

Steps S108 and S109 are executed during such three-word communication, as shown in FIG. 11F. That is, if a zero-cross or low level relative to the other channel has been detected by the zero-cross detector 35 during execution of the communication, there is set a standby state for start of the communication relative to the other channel.

In this example, the signal level of the right channel is turned to a zero level (or low level) at time point $t_{12}$ as shown in FIGS. 11C and 11D, so that a detection signal RZ is generated. However, since the serial data communication for the left channel has not yet been completed at this time point, a process for the right channel is held in a standby state as shown in FIG. 11E.

In the analog signal processing IC 20, upon completion of the three-word communication of FIG. 11F for the left channel at time point $t_{13}$, the analog gain controller 25 loads the analog gain set in the communication, thereby varying the left-channel gain of the analog volume rheostat 22. Consequently, the gain regarding the left-channel analog audio signal is switched at time point $t_{13}$, as shown in FIG. 11I.

The digital gain control for the left-channel digital audio signal is performed at the timing when the load signal generated at step S105 is inputted to the digital gain register 49 via the delay circuit 47. In FIG. 11G for example, a fall at time point $t_{17}$ in the waveform of the load signal obtained from the delay circuit 47 indicates the timing when the load signal is inputted to the digital gain register 49. And the digital gain register 49 loads the digital gain from the digital gain setter 54 in response to the load signal. Then the digital gain is given to the digital volume rheostat 33 via the switches 51 and 52, whereby the digital gain is varied.

More specifically, with regard to the left channel, the gain relative to the analog audio signal is switched at time point $t_{13}$ as shown in FIG. 11I, and thereafter the gain relative to the digital audio signal is switched at time point $t_{17}$ as shown in FIG. 11H.

When the result of a decision at step S107 signifies completion of the communication with regard to one channel, the process proceeds to step S110, where another decision is made as to whether the other channel is in a standby state or not. If the result of this decision signifies a standby state, the process proceeds to step S114.

If a zero level or low level of the other channel has not yet been detected, i.e., if the other channel is not in a standby state, the time-out counter 37 is actuated at step S111 to start counting the timer TO2, and thereafter at step S112, the timing controller 36 stands by to wait for detection of a zero level or low level of that channel. And upon detection of a zero level or low level, the process proceeds to step S114.

In case the counter TO2 is brought to a time-out while neither a zero level nor a low level is detected from that channel, the process forcibly proceeds from step S113 to S114.

From step S114 forth, interlocked control for the analog gain/digital gain is started with regard to the other channel.

First at step S114, the timing controller 36 generates a load signal relative to the other channel and then outputs such a load signal to the delay circuit (47 or 48).

As shown in FIG. 11E, the right channel is held in a standby state after detection of a zero-cross of the right channel during the communication relative to the left channel, so that the process proceeds directly from step S110 to step S114 at time point $t_{14}$ corresponding to completion of the communication with regard to the left channel. And at step S114, a load signal of the right channel is generated and then is supplied to the delay circuit 48. In FIG. 11G, an input to the delay circuit 48 is expressed as a rise at time point $t_{14}$.

Subsequently at step S115, the timing controller 36 enables the clock generator 45 and the serial data generator 46 to start communication to the analog signal processing IC 20 with regard to the other channel.

As shown in FIG. 11E, the communication data relative to the right channel begin to be transferred at time point $t_{14}$. More specifically, the clock generator 45 starts to output a clock signal SCK, while the serial data generator 46 generates the three-word communication data, such as those shown in FIG. 10, by using the analog gain value held in the analog gain setter 55, and then executes the three-word communication output relative to the right channel as shown in FIG. 11F.

In the analog signal processing IC 20, upon completion of the three-word communication of FIG. 11F for the right channel at time point $t_{15}$, the analog gain controller 25 loads the analog gain set in the communication, thereby varying the right-channel gain of the analog volume rheostat 22. Consequently, the gain regarding the right-channel analog audio signal is switched at time point $t_{15}$, as shown in FIG. 11I.

The digital gain control for the right-channel digital audio signal is performed at the timing when the load signal generated at step S114 is inputted to the digital gain register 50 via the delay circuit 48. In FIG. 11G for example, a fall at time point $t_{18}$ in the waveform of the load signal obtained from the delay circuit 48 indicates the timing when the load signal is inputted to the digital gain register 50. And the digital gain register 50 loads the digital gain from the digital gain setter 54 in response to the load signal. Then the digital gain is given to the digital volume rheostat 33 via the switches 51 and 52, whereby the right-channel digital gain is varied.

More specifically, with regard to the right channel, the gain relative to the analog audio signal is switched at time point $t_{15}$ as shown in FIG. 11I, and thereafter the gain relative to the digital audio signal is switched at time point $t_{18}$ as shown in FIG. 11H.

When the result of a decision at step S116 signifies completion of the communication with regard to the other channel, the timing controller 36 instructs the switch control 39 at step S117 to connect the switches 41 and 42 to the contacts $T_2$, thereby permitting direct communication from the microcomputer to the analog signal processing IC, and thus the series of interlocked gain control actions are completed.

In the gain varying device of this embodiment where the above operation is performed, there exists a timing deviation between the analog gain switching and the digital gain switching relative to each channel corresponding to the time difference obtained by subtracting the time, which is required for the serial data communication, from the delay time caused by the delay circuits 47 and 48.

Therefore, the delay time due to the delay circuits 47 and 48 is set in such a manner that the above time difference becomes equal to the processing time required in the A-D converter 23 and so forth (i.e., the input time difference between the analog volume rheostat 22 and the digital volume rheostat 23). Consequently, in respect of the signal of each channel, the analog gain and the digital gain are switched at the same timing, that is, it becomes possible to realize smooth switching without occurrence of any gain level difference with respect to the total gain. As a result, no noise is generated at the time of switching the gain.

Although the gain switching is performed individually with regard to each of the left and right channels, the trigger timing to determine the timing of switching the analog gain/digital gain in each channel is the same. More specifically, as shown in FIG. 11E, the individual timing of switching the analog gain and the digital gain in the left channel begins to be controlled at time point $t_{11}$; while the individual timing of switching the analog gain and the digital gain in the right channel begins to be controlled at time point $t_{14}$.

And even if a zero cross is detected in the other channel during communication of one channel, the process for the other channel is held in a standby state. In the case of FIG. 11E for example, the process for the right channel is deferred during a period from time point $t_{12}$ to time point $t_{14}$.

Owing to the above control systems, it is possible to realize the desired analog and digital gain switching with a predetermined time difference in each channel regardless of the zero-cross timing and so forth in the other channel.

In this embodiment also, similarly to the foregoing first embodiment, the gain is varied at a pitch of 0.25-dB step and at a small interval in the digital volume rheostat 33 during the period in which the analog volume rheostat 22 executes a 2-dB gain variation, so that the operation of varying the total gain can be performed at a small pitch of 0.25-dB variation step, hence realizing satisfactory variations of the sound volume level with a natural feeling. In addition, it becomes possible to eliminate the necessity of increasing the number of resistance elements or analog switches in the analog volume rheostat 22 for reducing the pitch of gain variation steps.

In this embodiment where the zero-cross detector 35 is provided in the DSP 30 to detect a zero cross or low level in the stage of digital data, the signal obtained via the high pass filter 32 after analog-to-digital conversion is inputted to the zero-cross detector 35.

If the A-D converter 23 employed herein is an integral type, there may occur a DC offset as is generally known. For the purpose of averting such a disadvantage, this embodiment is so constructed as to perform zero-cross detection after removal of the DC offset component by means of the high pass filter 32, hence preventing any hindrance that may otherwise be caused to the detection because of the DC offset derived from the A-D converter 23, thereby ensuring satisfactory detection of a zero cross or low level.

Further in the zero-cross detector 35, any low level within a certain range is also regarded as a zero cross to consequently eliminate difficulty in triggering a start of the interlocked gain control.

More specifically, after an instruction is given from the microcomputer to perform the interlocked gain control, the process subsequent to step S105 in FIG. 12 is executed in response to a zero-cross detection in one channel applied as a trigger. However, when the signal condition is such that a zero cross does not appear so readily, any low level within a predetermined extent is regarded as a zero cross to thereby reduce the delay in starting the actual process after reception of the instruction from the microcomputer, while enabling desired gain variation at an adequate timing to a certain degree.

Since a time-out is set in the timer TO1, the maximum time from the instruction for execution of the process to the actual start thereof can be ensured even when neither zero cross nor low level is obtained.

When the process has advanced to the other channel after variation of the analog gain in one channel, a time-out is set in the timer TO2 in case a zero cross or a low level is not yet detected in the other channel until then. Therefore, even if neither zero cross nor low level is obtained, the process for the other channel is started properly due to the time-out.

Consequently, there never occurs a wide timing difference in switching the signal gains of the left and right channels, hence preventing a deviation in the normal position of the audio signal.

Moreover, this second embodiment is so contrived that, during the interlocked analog/digital gain control performed from the DSP 30 to the analog signal processing IC 20, direct communication from the microcomputer to the analog signal processing IC 20 is inhibited.

In the analog signal processing IC 20, there exists a case where, in addition to the interlocked analog/digital gain control, the gain variation is executed under control of the microcomputer. In this case, a timing confusion may occur if serial data communication is executed from the microcomputer to the analog signal processing IC 20 in the zero-cross standby period to wait for the start of the interlocked analog/digital gain control. Such an undesired state can be avoided by inhibiting direct communication from the microcomputer to the analog signal processing IC 20 during the interlocked analog/digital gain control.

In the second embodiment where the analog volume rheostat for the analog signal is controlled by the DSP, zero-cross gain switching can be executed by the analog volume rheostat even if it is not equipped with a function of zero-cross detection.

Besides the above features, since communication can be performed via the DSP 30 without connection of the analog signal processing IC 20 to the bus, the control signal state is not drifted unnecessarily to thereby achieve reduction of plunge noise.

<Third Embodiment>

Figure 13B:
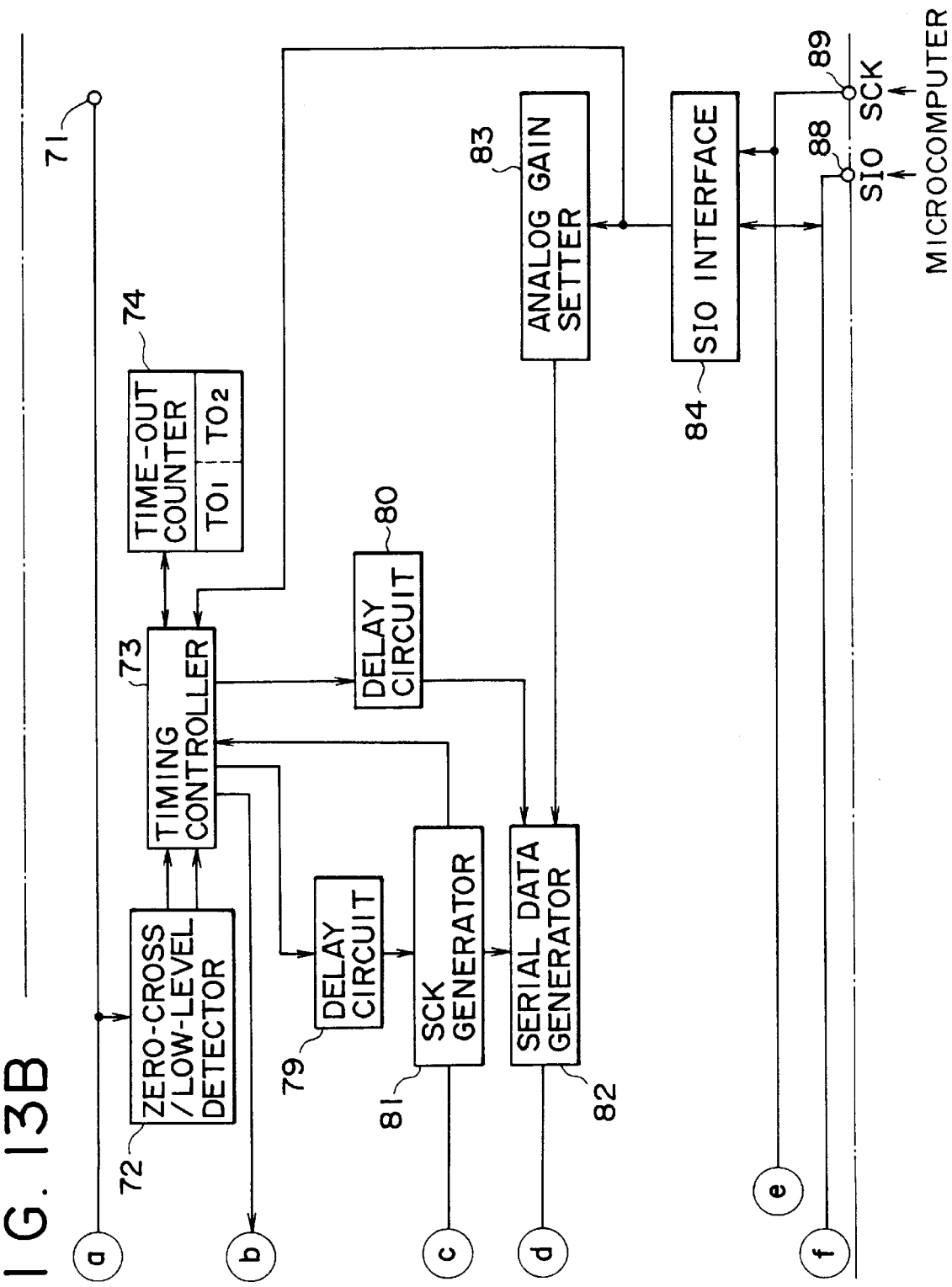
FIG. 13 is a block diagram of a third embodiment of the present invention.

The circuit configuration of a third embodiment is shown in FIG. 13.

In FIG. 13, a gain varying device consists of an analog signal processing IC 60 and a DSP 70.

An analog gain is switched in the analog signal processing IC 60, and gain switching control is performed through serial data communication from the DSP 70.

More specifically, a microcomputer (main controller) sets the analog gain in the DSP 70 through serial data communication, and then, in response to detection of a zero-cross, the DSP 70 sets the analog gain in the analog signal processing IC 60 through serial data communication, thereby realizing interlocked variation control of the analog gain.

This gain varying device is adapted for use in a circuit system where digital audio data to be recorded are converted into analog data and then are delivered as a monitor output, or for use in a circuit system where digital audio data read out from a recording medium are converted into analog data and then are delivered as a playback output.

A digital audio signal is inputted to a terminal 71 of the DSP 70. The digital audio signal thus inputted is supplied to a zero-cross detector 72 while being delivered from a terminal 85 to be inputted to a terminal 61 of the analog signal processing IC 60. Thereafter the digital audio signal is converted into an analog audio signal by a D-A converter 62 and then is supplied to an analog volume rheostat 63.

The signal controlled to be given a required gain in the analog volume rheostat 63 is supplied from a terminal 64 to a monitor circuit system or a playback output circuit system.

The gain of the analog volume rheostat 63 is varied by an analog gain controller 65, and a desired value of the analog gain is set in a serial data receiver 66 through serial data communication from the DSP 70. A clock signal SCK for the serial data communication is inputted to a terminal 67, while words for the serial data communication, such as those shown in FIG. 10, are inputted to a terminal 68.

The analog gain controller 65 loads the value of the analog gain in accordance with the three-word serial data written in the serial data receiver 66, and controls the gain of the analog volume rheostat 63.

The clock signal SCK and the data words for the serial data communication from the microcomputer are inputted to the DSP 70 via terminals 89 and 88 thereof, respectively.

In the DSP 70, commands and the indicated analog gain value included in the contents of serial data communication are taken in via an interface 84.

And subsequently an operation of a timing controller 73 for analog gain variation is started in response to the analog gain variation command. The indicated analog gain value is written in an analog gain setter 83.

The analog gain value thus set in the analog gain setter 83 is supplied to a serial data generator 82, where three-word communication data such as those shown in FIG. 10 are generated.

When serial data communication is performed from the DSP 70 to the analog signal processing IC 60 for controlling the analog gain, switches 77 and 78 are connected to contacts $T_1$ respectively.

Accordingly, the clock signal SCK generated from the clock generator 81 and the three-word data generated from the serial data generator 82 are outputted respectively from the terminals 86 and 87 of the DSP 70 to the analog signal processing IC 60.

In any mode other than the analog gain control, normally the switches 77 and 78 are connected to the contacts $T_2$ thereof, respectively, whereby direct serial data communication is rendered possible from the microcomputer to the analog signal processing IC 60. Consequently, in varying the analog gain unrelated to zero-cross detection for example, it becomes possible for the microcomputer to directly instruct the analog signal processing IC 60 to vary the gain.

The zero-cross detector 72 detects a zero-cross timing of the digital audio signal and then outputs a zero-cross detection signal to the timing controller 73.

Further, even when the signal is not exactly at its zero level, the zero-cross detector 72 detects, within a predetermined range, if the signal is at any level proximate to its zero level and then outputs a zero-cross detection signal in such a case as well. More specifically, if the signal is at a sufficiently low level to a certain extent, it is regarded as a zero cross.

The timing controller 73 controls various timings for varying the analog gain in accordance with the gain variation command obtained from the microcomputer through serial data communication and the zero-cross detection signal from the zero-cross detector 72.

Serial data communication is performed from the DSP 70 to the analog signal processor 60 to execute control of the analog gain. For this purpose, the timing controller 73 sends, at a predetermined timing, a clock start control signal which instructs the clock generator 81 to start output of a clock signal SCK. In this case, the clock start control signal is supplied via a delay circuit 79 to the clock generator 81.

Further the timing controller 73 instructs the serial data generator 82, via a delay circuit 80, to generate three-word data such as those shown in FIG. 10.

Upon completion of the serial data communication, an end signal is transmitted from the clock generator 81 to the timing controller 73.

During the serial data communication from the DSP 70 to the analog signal processor 60, a switch control 76 is so instructed as to fix connection of the switches 77 and 78 to the contacts $T_1$ respectively, so that if there occurs transmission of direct communication during this period from the microcomputer to the analog signal processing IC 60, such direct communication is inhibited.

In response to a trigger from the timing controller 36, a time-out counter 74 counts timers TO1 and T02. The count-up data of the timers TO1 and T02 are supplied to the timing controller 73.

In the gain varying device of the configuration mentioned above, the analog gain control operation is performed in the following manner.

The analog gain variation control is started with setting of an analog gain value through serial data communication from the microcomputer.

The microcomputer sets the gain value in the analog gain setter 83. And in response to input of such communication to the timing controller 73, this controller 73 is placed in its standby state to wait for a zero-cross detection signal from the zero-cross detector 72, and simultaneously the switch controller 76 is so instructed to connect the switches 77 and 78 to the contacts $T_1$, thereby inhibiting direct communication (through communication) from the microcomputer to the analog signal processing IC 60. And the time-out counter 74 is actuated to start counting the timer TO1.

Suppose now that a zero-level or low-level detection signal relative to the digital audio signal is supplied at a certain time point from the zero-cross detector 72 to the timing controller 73, or the counter 74 is brought to a time-out with no detection of any zero level or low level. In this case, the timing controller 73 sends a clock start control signal which instructs the clock generator 81 to start output of a clock signal SCK, and further sends a signal for instructing the serial data generator 46 to start generation and output of the three-word communication data.

Since these signals are supplied via delay circuits 79 and 80, respectively, to the clock generator 81 and the serial data generator 46, communication for the analog gain control is executed from the DSP 70 to the analog signal processing IC 60 after a lapse of a predetermined time from detection of a zero cross or low level or from shift to a time-out.

Upon completion of the three-word communication for the analog gain control, the analog gain controller 65 in the analog signal processing IC 60 loads the analog gain set through the communication and then varies the gain of the analog volume rheostat 63.

In the description given hereinabove, an explanation is omitted with respect to individual control of the left and right channels. However, it is to be understood that, as in the second embodiment already mentioned, each of the left and right channels can be controlled individually.

In the gain varying device of this embodiment, the timing to switch the analog gain is delayed for a certain time period which is a total of adding the delay times caused due to the delay circuits 79 and 80 from the zero-cross detection timing in the digital stage and the time required for the serial data communication.

Therefore, the delay times of the delay circuits 79 and 80 are so preset that a total of such delay times of the delay circuits 79, 80 and the serial data communication time becomes equal to the processing time in the D-A converter 62 and so forth (i.e., the input time difference between the zero-cross detector 72 and the analog volume rheostat 63), whereby the gain can be switched at the zero-cross timing in the analog volume rheostat 63.

Consequently, when changing the sound volume of the recording monitor in the recording mode or when changing the reproduced output sound volume, it is possible to achieve noiseless gain variation at a zero-cross point. Muting is also rendered executable by turning the analog volume rheostat to its minimum, and generation of noise can be suppressed by switching on/off the mute at a zero-cross point.

In this third embodiment also, similarly to the foregoing second embodiment, advantageous effects are attainable in execution of serial data communication.

It is a matter of course that the present invention is not limited merely to the first to third embodiments mentioned, and a variety of modifications thereof may be contrived as well.

In the gain varying device of the present invention, as described hereinabove, the control action is so performed that an analog gain varying means and a digital gain varying means are mutually interlocked to execute the operation of varying the gains in response to detection of the zero-cross timing of the signal applied as a trigger. Particularly the timing of executing each gain varying operation is controlled on the basis of the difference between the timing of passage of the signal through the analog gain varying means and the timing of passage of the signal through the digital gain varying means. Due to such control for varying the two gains, it follows that, in respect of the input signal, the analog gain and the digital gain are switched at the same zero-cross timing, whereby smooth gain switching can be realized in the total gain without generation of the gain difference. As a result, no noise is generated at the time of switching the gains.

Further, the gain may be varied at a small pitch of variation steps in the digital gain varying means during the period in which the analog gain varying means executes its gain variation at a relatively large pitch of steps, so that the operation of varying the total gain can be performed at a small pitch of variation steps to thereby realize satisfactory variations of the sound volume level with a natural feeling. In addition, it becomes possible to eliminate the necessity of increasing the number of resistance elements or analog switches in the analog gain varying means for reducing the pitch of gain variation steps, hence preventing an enlarged scale in the circuit configuration of the analog gain varying means.

Moreover, the control means performs its control action in such a manner that detection of a zero-cross timing of the signal or any timing proximate thereto is applied as a trigger for the gain varying operation, and even when neither zero-cross timing nor any timing proximate thereto is detected, the analog gain varying means and the digital gain varying means execute the individual operation respectively after a lapse of the predetermined time in a standby mode, whereby some difficulty is eliminated in triggering a start of the interlocked gain varying process while the maximum time is ensured from instruction for the execution to a start of the actual process. Consequently, it becomes possible to achieve proper gain variation at an adequate timing without delaying the start of the gain varying process.

Besides the above features, there is included a high pass filter means for the digital signal outputted from the A-D converter means, and the control means detects a zero-cross timing with regard to the digital signal outputted from the high pass filter means, hence preventing occurrence of any hindrance that may otherwise be caused in the zero-cross detection due to the DC offset derived from the A-D converter means, thereby attaining satisfactory detection of a zero cross or a low level.

When the signal is composed of a plurality of channels and each of the analog and digital gain varying means is so formed as to be capable of varying the gain under control with regard to each of the channels, the control means controls execution of the gain varying operation in such a manner that the time difference between the gain varying operation for one channel and that for the other channel does not exceed a predetermined time period, whereby a wide timing difference is never induced in switching the signal gains of the two channels, hence preventing a deviation in the normal position of the audio signal.

Since the control means enables one or both of the analog gain varying means and the digital gain varying means to execute the gain varying operation by serial control signals, there is attained an advantageous effect of realizing, for any gain varying means without a function of zero-cross detection, control of gain switching at a zero-cross timing or control of interlocked gain switching.

For example, in a configuration where the analog gain varying means for the analog signal system is controlled by the control means disposed on the same chip as the digital gain varying means, even if the analog gain varying means has no function of zero-cross detection or interlocked timing control, it is still possible to execute analog gain switching at a zero-cross timing or interlocked gain control with the digital gain.

Besides the above, since communication can be performed from the control means without connection of such controlled circuits to the bus, the control signal condition is not drifted unnecessarily to thereby achieve reduction of plunge noise.

During the process for execution of the gain varying operation by the analog gain varying means and the digital gain varying means interlocked mutually, the control means inhibits supply of a gain variation command from any other control means to the analog gain varying means or the digital gain varying means, whereby it is rendered possible to prevent an impediment caused to an accurate operation by a timing confusion in the communications.

Furthermore, the gain varying device is so composed as to include an analog gain varying means capable of varying the gain with regard to the analog signal outputted from a D-A converter means, and a control means for detecting a zero-cross timing from the digital signal and, by applying detection of the zero-cross timing as a trigger, enabling the analog gain varying means to execute its gain varying operation at the zero-cross timing of the signal inputted thereto. Consequently, even if the analog gain varying means is not equipped with a function of zero-cross detection, it is enabled to perform proper analog gain switching at a zero-cross timing, so that an advantageous effect of realizing noiseless gain variation at a zero-cross point is achievable in switching the sound volume of a recording monitor or a reproduced audio signal, or in executing a muting process.

What is claimed is:

1. A gain varying device comprising:

analog gain varying means for varying a gain of an input analog signal;

zero-cross detector means for detecting a zero cross in the input analog signal;

analog-digital converter means for converting into a digital signal the analog signal from said analog gain varying means;

digital gain varying means for varying a gain of the digital signal converted by said analog-digital converter means; and control means for controlling gain variation timing of said analog gain varying means and gain variation timing of said digital gain varying means in response to zero-cross timing detected by said zero-cross dectector means, wherein the gain variation timing by the digital and analog gain varying means are separated by a predetermined time interval.

2. A gain varying device according to claim 1, wherein said zero-cross detector means detects both a timing of a zero-cross of the input analog signal and a timing when the input analog signal is in a vicinity thereof.

3. A gain varying device according to claim 1, wherein a pitch of gain variation steps in said analog gain varying means is greater than a pitch of gain variation steps in said digital gain varying means.

4. A gain varying device according to claim 1, further comprising delay means for delaying the zero-cross timing detected by said zero-cross detector means, wherein the gain variation timing of said analog gain varying means is controlled in response to the zero-cross timing obtained from said zero-cross detector means, and the gain variation timing of said digital gain varying means is controlled in response to an output of said delay means.

5. A gain varying device according to claim 4, wherein a delay time provided by said delay means corresponds to a processing time in said analog-digital converter means.

6. A gain varying device comprising:

analog gain varying means for varying a gain of an input analog signal;

analog-digital converter means for converting into a digital signal an analog signal from said analog gain varying means;

zero-cross detector means for detecting a zero cross or a signal level in a vicinity thereof in the digital signal from said analog-digital converter means;

digital gain varying means for varying a gain of the digital signal from said analog-digital converter means;

transfer means for transferring predetermined communication data to said analog gain varying means and to said digital gain varying means; and control means for selectively permitting transfer or inhibiting transfer of the communication data from said transfer means to said analog gain varying means in response to a timing of the detected zero cross or signal level in the vicinity thereof detected by said zero-cross detector means, wherein said communication data is transferred to said analog gain varying means after a predetermined time delay.

7. A gain varying device according to claim 6, further comprising high-pass filter means for filtering the digital signal output of said analog-digital converter means, wherein said zero-cross detector means detects a zero cross or a signal level in the a vicinity thereof in an output signal of said high-pass filter means.

8. A gain varying device according to claim 6, wherein said predetermined communication data includes at least one of a gain setting value and a controlled-channel identification signal.

9. A gain varying device according to claim 6, wherein, when neither a zero cross nor a signal level in the vicinity thereof is detected by said zero-cross detector means within a predetermined time period, said control means causes said digital gain varying means and said analog gain varying means to execute respective operations for gain variation.

10. A gain varying device according to claim 6, wherein said input analog signal is composed of a plurality of channels and when said analog gain varying means and said digital gain varying means execute respective operations for gain variation with regard to each of the channels, said control means controls a time difference between the gain varying operation for one channel and the gain varying operation for another channel, so that the time difference does not exceed a predetermined time period.

11. A gain varying device comprising:

zero-cross detector means for detecting a zero cross or a signal level in a vicinity thereof in an input digital signal;

digital-analog converter means for converting the input digital signal into an analog signal;

analog gain varying means for varying a gain of the analog signal converted by said digital-analog converter means; and control means for switching and controlling a gain variation timing of said analog gain varying means in response to an output of said zero-cross detector means.

* * * * *